(12) United States Patent
Hosono et al.

(10) Patent No.: US 6,882,569 B2
(45) Date of Patent: Apr. 19, 2005

(54) NON-VOLATILE SEMICONDUCTOR MEMORY DEVICE

(75) Inventors: Koji Hosono, Yokohama (JP); Kenichi Imamiya, Tokyo (JP); Hiroshi Nakamura, Fujisawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/918,686

(22) Filed: Aug. 13, 2004

(65) Prior Publication Data

US 2005/0029051 A1 Feb. 10, 2005

Related U.S. Application Data

(63) Continuation of application No. 10/360,586, filed on Feb. 6, 2003, now Pat. No. 6,798,697.

(30) Foreign Application Priority Data

Feb. 6, 2002 (JP) .......................................... 2002-29972

(51) Int. Cl.[7] .............................................. G11C 16/04
(52) U.S. Cl. ............................ 365/185.17; 365/185.12; 365/185.18
(58) Field of Search ....................... 365/185.17, 185.12, 365/185.18

(56) References Cited

U.S. PATENT DOCUMENTS 5,465,235 A 11/1995 Miyamoto
6,195,286 B1 2/2001 Pascucci
6,411,548 B1 * 6/2002 Sakui et al. ............ 365/185.17
6,671,204 B1 * 12/2003 Im ......................... 365/185.12
6,731,540 B1 5/2004 Lee et al.

FOREIGN PATENT DOCUMENTS

JP 07-122092 5/1995
JP 11-175391 7/1999

OTHER PUBLICATIONS

U.S. Appl. No. 10/194,337, Jul. 12, 2002.

* cited by examiner

Primary Examiner—Huan Hoang
(74) Attorney, Agent, or Firm—Hogan & Hartson, LLP

(57) ABSTRACT

A non-volatile semiconductor memory device includes a memory cell array with electrically rewritable non-volatile memory cells laid out therein, an address selector circuit for performing memory cell selection of the memory cell array, a data read/write circuit arranged to perform data read of the memory cell array and data write to the memory cell array, and a control circuit for executing a series of copy write operations in such a manner that a data output operation of from the data read/write circuit to outside of a chip and a data write operation of from the data read/write circuit to the memory cell array are overlapped each other, the copy write operation including reading data at a certain address of the memory cell array into the data read/write circuit, outputting read data held in the read/write circuit to outside of the chip and writing write data into another address of the memory cell array, the write data being a modified version of the read data held in the data read/write circuit as externally created outside the chip.

20 Claims, 20 Drawing Sheets

[Program]  [Erase]

<Read from Row1 cells>

"0"cell "H"
"1"cell "L"

<Serial Output>

<Data Addition>

<Program to RowA cells>
Invert, Transfer N21→N11

<Read from Row2 cells>

"0"cell "H"
"1"cell "L"

<Program (RowA) & Serial Output (Row2)>

<Data Addition to Row2>

<Program completion to RowA cells>

[Read Operation]

[Normal Program Operation]

[Copy Program Operation of Embodiments 1 to 4]

<Read from Row1 cells>

"0"cell "H"
"1"cell "L"

<Serial Output>

<Data Addition>

<Program to RowA cells>
Normal Transfer N21→N11

<Read from Row2 cells>

"0" cell "H"
"1" cell "L"

<Program (RowA) & Serial Output (Row2)>

<Data Addition to Row2>

<Program completion to RowA cells>

NON-VOLATILE SEMICONDUCTOR MEMORY DEVICE

CROSS-REFERENCE TO RELATED APPLICATION

This is a continuation of application Ser. No. 10/360,586 filed February 6, 2003 now U.S. Pat. No. 6,798,697, which application is hereby incorporated by reference in its entirety.

This application is based upon and claims the benefit of priority from the prior Japanese Application No. 2002-29972, filed on Feb. 6, 2002, the entire of which is incorporated herein by reference.

BACKGROUND OF THE INVENTION

1. Field of the Invention

This invention relates generally to an electrically rewritable non-volatile semiconductor memory device and, more particularly, to page copy control methods thereof.

2. Description of Related Art

Electrically rewritable nonvolatile semiconductor memories include a flash memory of the so-called NAND type. In this NAND type flash memory, a technique for performing page copy operations has already been proposed. A page copy operation is for writing or programming cell data of a page into another page. What are mainly required for achieving such copy writing functionality are: (1) speed-up of write data transfer rate, and (2) higher reliability of copy writing.

The speedup or acceleration of the copy operation is achievable by designing a page copy as an on-chip operation of a NAND flash memory. More specifically, a high-speed copy operation is made possible by reading data of a first page of a memory cell array to a sense amplifier and then writing the read data into a second page without outputting the read data to external terminals (for example, see U.S. Pat. No. 5,465,235). This scheme is capable of shortening the length of a write processing time period because of that the read data is not output to outside of a chip; however, the scheme is incapable of eliminating risks as to unwanted data alteration or corruption occurring when repeating copy write operations.

On the other hand, the reliability of copy writing can be guaranteed by letting the read data of a sense amplifier be output toward the outside of the chip. This can be said because such sense-amp data output permits an externally provided memory controller to perform inspection or testing of write data. Unfortunately in this case, the resulting write data transfer rate becomes sacrificed significantly.

FIG. 23 shows an exemplary copy write operation which is designed to output read data to the chip outside. Shown herein is an example of a per-page repeated copy operation which includes the steps of reading data of a page address Row1, writing the data into a page address RowA, sequentially reading data of a page address Row2, and writing the data into a page address RowB.

The data readout of the page address Row1 is performed in receipt of a read command "Read com." input and an address "Add.(Row1)" input. During a data read operation of from the memory cell array to sense amplifier, the memory chip is set in a busy state. "Data Out(Row1)" indicates such an operation that a page of data of the address Row1 read to the sense amp are serially transferred by a read enable signal REB and then output toward the chip outside. The data output to the chip outside is then tested by a memory controller. And, sequentially inputting a load command "Load com.", address "Add.(RowA)", additional or extra write data "Data(extra)" and write command "Prog. Com." results in that a write operation to the page address RowA is performed. During this write operation, the memory is in a busy state. If any data modification or correction is not necessary, it is no longer required to perform any extra data input from the outside. Additionally, the extra data may alternatively be partially modified data or one page of data. The extra data is overwritten onto the read data being presently held in a page buffer and then used as corrected write data. After completion of the write operation to the page address RowA, data reading of the page address Row2 and writing of such read data into the page address RowB are performed in a similar way.

With the prior art copy writing scheme stated above, whenever an attempt is made to guarantee the reliability, a control technique becomes inevitable for outputting the read data to the chip outside and performing the next read operation after having completed a write operation as shown in FIG. 23. In this scheme, a serial output time taken for copy data check becomes a significant factor or cause which deteriorates the high speed performance of the copy operation. A more detailed explanation is as follows. When the data read time of from the memory cell array to the sense amplifier is set at 25 microseconds ($\mu$sec), the memory cell array's data writing time is 200 $\mu$sec, the page length is 2 kilobytes (kB), and the cycle of serial transfer of sense amp data to the chip outside is 50 nanoseconds (nsec), the transfer rate is calculated as 6.2 megabytes per second (MB/sec). This is in the case of ignoring a data adding time during copy operations. For speedup of the write transfer rate, the read data's serial output time period (50 nsec×2k= 100 $\mu$sec) becomes a large overhead.

SUMMARY OF THE INVENTION

A nonvolatile semiconductor memory device includes:

a memory cell array with electrically rewritable non-volatile memory cells laid out therein;

an address selector circuit for performing memory cell selection of the memory cell array;

a data read/write circuit arranged to perform data read of the memory cell array and data write to the memory cell array; and a control circuit for executing a series of copy write operations in such a manner that a data output operation of from the data read/write circuit to outside of a chip and a data write operation of from the data read/write circuit to the memory cell array are overlapped each other, the copy write operation including reading data at a certain address of the memory cell array into the data read/write circuit, outputting read data held in the read/write circuit to outside of the chip and writing write data into another address of the memory cell array, the write data being a modified version of the read data held in the data read/write circuit as externally created outside the chip.

DETAILED DESCRIPTION OF THE EMBODIMENTS

Several embodiments of this invention will be explained with reference to the accompanying drawings below.

[Embodiment 1]

Figure 1:
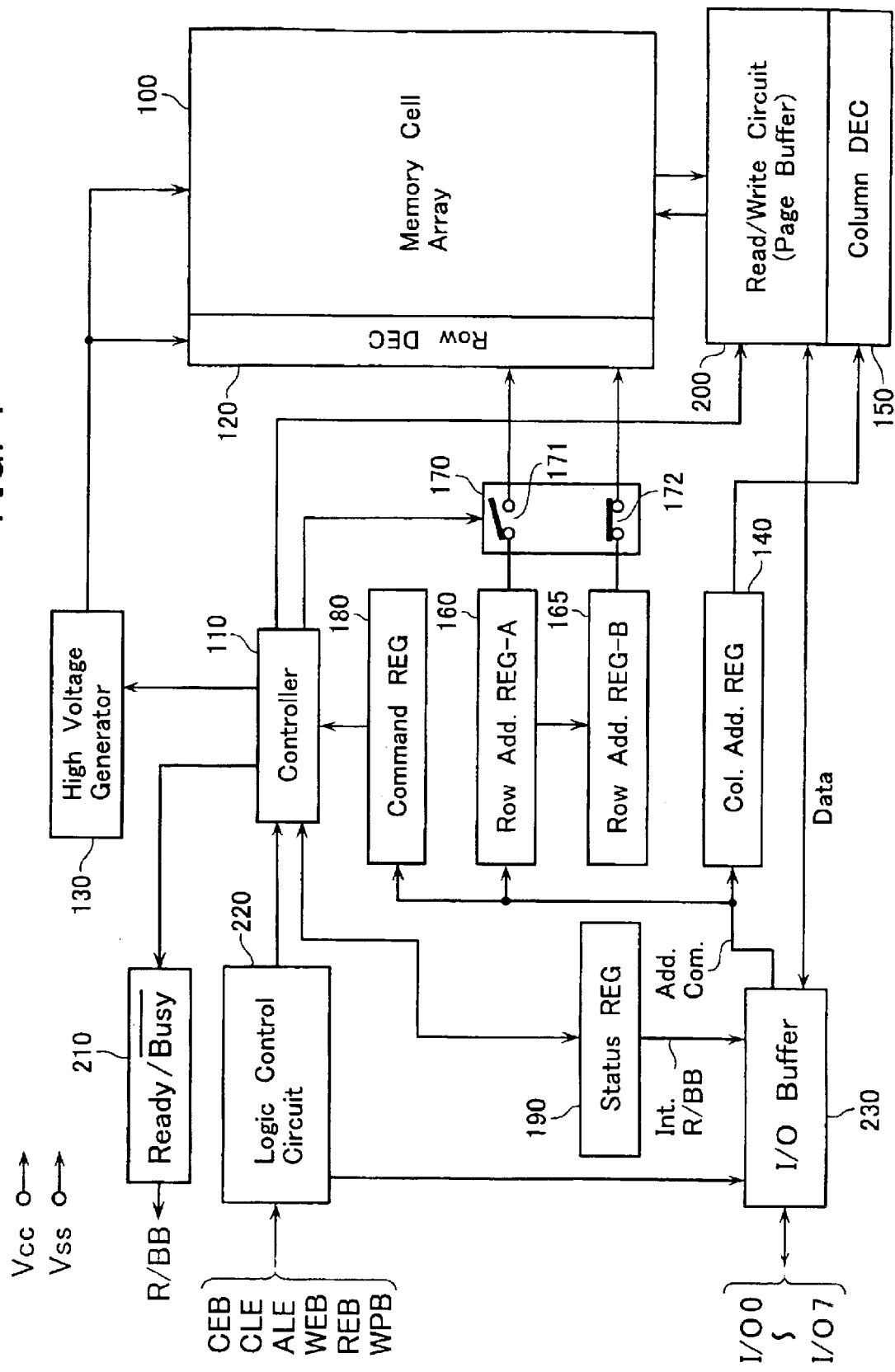
FIG. 1 is a diagram showing an overall configuration of a NAND type flash memory in accordance with an embodiment 1 of this invention.
Figure 2:
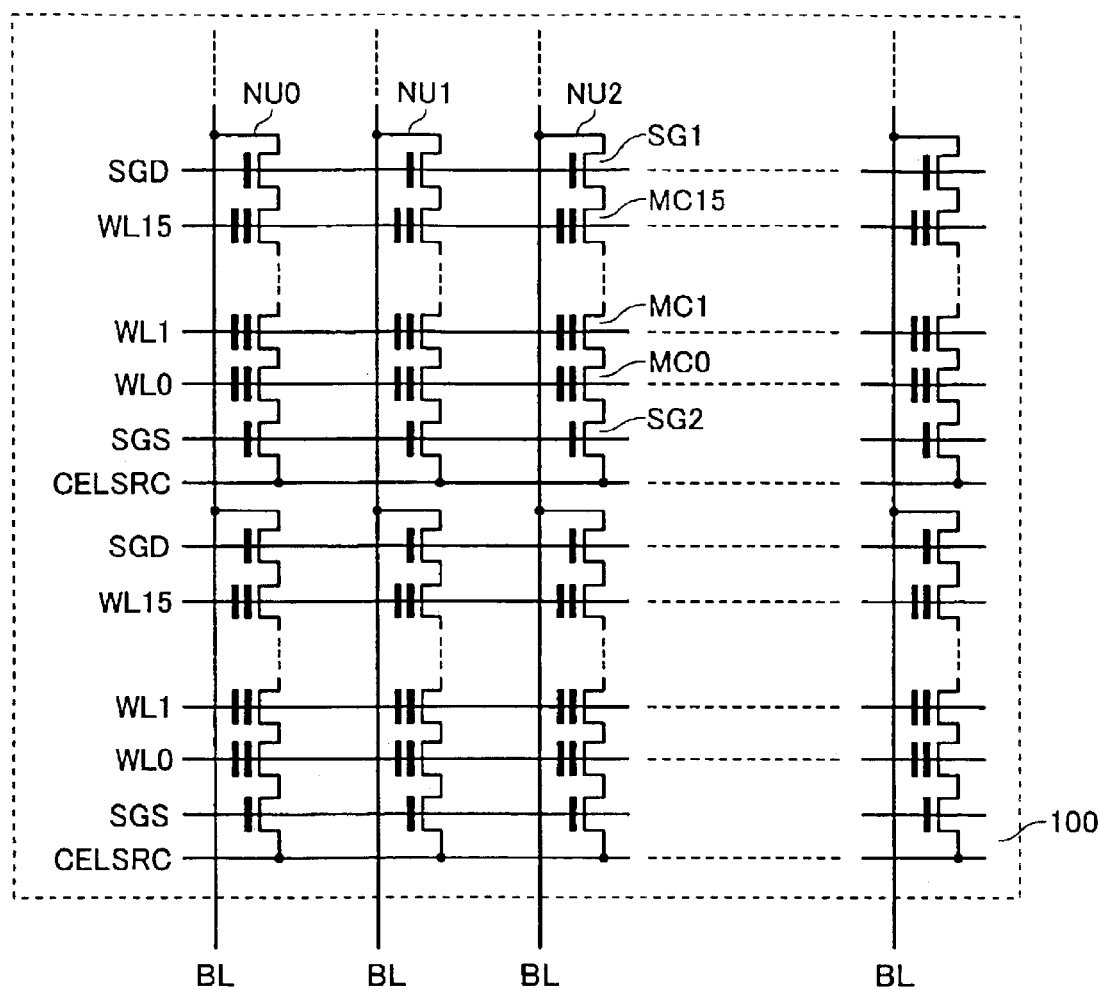
FIG. 2 is a diagram showing an arrangement of a memory cell array of the embodiment 1.

FIG. 1 is a block diagram which shows an overall configuration of a NAND type "flash" electrically erasable programmable read-only memory (flash EEPROM) in accordance with an embodiment of this invention. As shown in FIG. 2, a memory cell array 100 is arranged so that a plurality of (sixteen, in an example of the drawing) electrically rewritable nonvolatile memory cells MC0 to MC15 of the stacked gate structure type are connected in series to constitute NAND cell units NU (NU0, NU1, . . . ). Each NAND cell unit NU has terminate ends, one of which is connected to a bit line BL through a select gate transistor SG1 and the other of which is connected to a common source line CELSRC via a select gate transistor SG2. Control gates of memory cells MC which are arrayed in a row direction are commonly connected together to a word line WL; gate electrodes of the select gate transistors SG1, SG2 are connected to select gate lines SGD, SGS which are provided and laid out in parallel with the word line WL.

A range of memory cells which are selected by a single word line WL is a page that becomes a unitary part of writing or "programming" and also a unit of reading. One page or a range of its integral multiple of a plurality of NAND cell units NU becomes a block that is a unit of data erase.

A data read/write circuit 200 circuit includes sense amplifier circuits (SA) and latch circuits (DL), which are provided in units of bit lines in order to perform data reading and writing (programming) operations in a parallel fashion with respect to a plurality of cells at a certain address of the memory cell array 100. Although an actual example of the data read/write circuit 200 will be described in detail later, it is arranged to have two page buffers in order to perform copy writing on a per-page basis—say, page copy writing—in addition to ordinary or normal data reading and writing operations in units of pages of the memory cell array 100.

To perform selection of a word line WL and bit line BL of the memory cell array 100, a row decoder 120 and a column decoder 150 are provided respectively. A control circuit 110 performs sequence control of normal data write or "program", erase and read and also performs sequence control of copy write operations. A high-voltage generation circuit 130 which is controlled by the control circuit 110 generates and issues a potentially raised or "boosted" high voltage and intermediate voltages, which will be used for data write, erase and read.

An input/output buffer 230 is used for data input/output and also for input of commands and address signals. More specifically, through the input/output buffer 230, data transmission is performed between external input/output terminals I/O0 to I/O7 and the data read/write circuit 200. Address signals to be input from the I/O terminals are retained at address registers 140, 160 and sent forth toward a column decoder 150 and a row decoder 120 respectively and then decoded thereby. An input command is decoded and held at a command register 180, whereby the control circuit is controlled.

External control signals, such as a chip enable signal CEB, a command latch enable signal CLE, an address latch enable signal ALE, a write enable signal WEB, a read enable signal REB, a write protect signal WPB and the like, are input to an operation logic control circuit 220; based on their logics, internal control signals are generated in accordance with an operation mode. The internal control signals are used for control of data latch and transfer or the like at the input/output buffer 230 and are sent to the control circuit 110 so that operation control is carried out.

In this way, the NAND type flash memory of this embodiment operates by the control using command input accompanying address input or alternatively the control of command input alone. When the command register 180 receives and accepts a specified command, the control circuit 100 performs control of writing or programming operations and others. The control circuit 100, not only controls a memory core unit for execution of an operation while being instructed by a command, but also controls for high voltages generation required and performs control of status registers 210 and 190 to output a busy signal which notifies of the outside that automated processing is presently performed within the chip, and output of an internal busy signal.

In this embodiment, in order to perform copy write control, a row address register 165 of another system is provided in addition to the row address register 160. An address switch circuit 170 is provided between output sections of the row address registers 160, 165 and the row decoder 120 so that a row address of either one of them is supplied to the row decoder 120.

Figure 3:
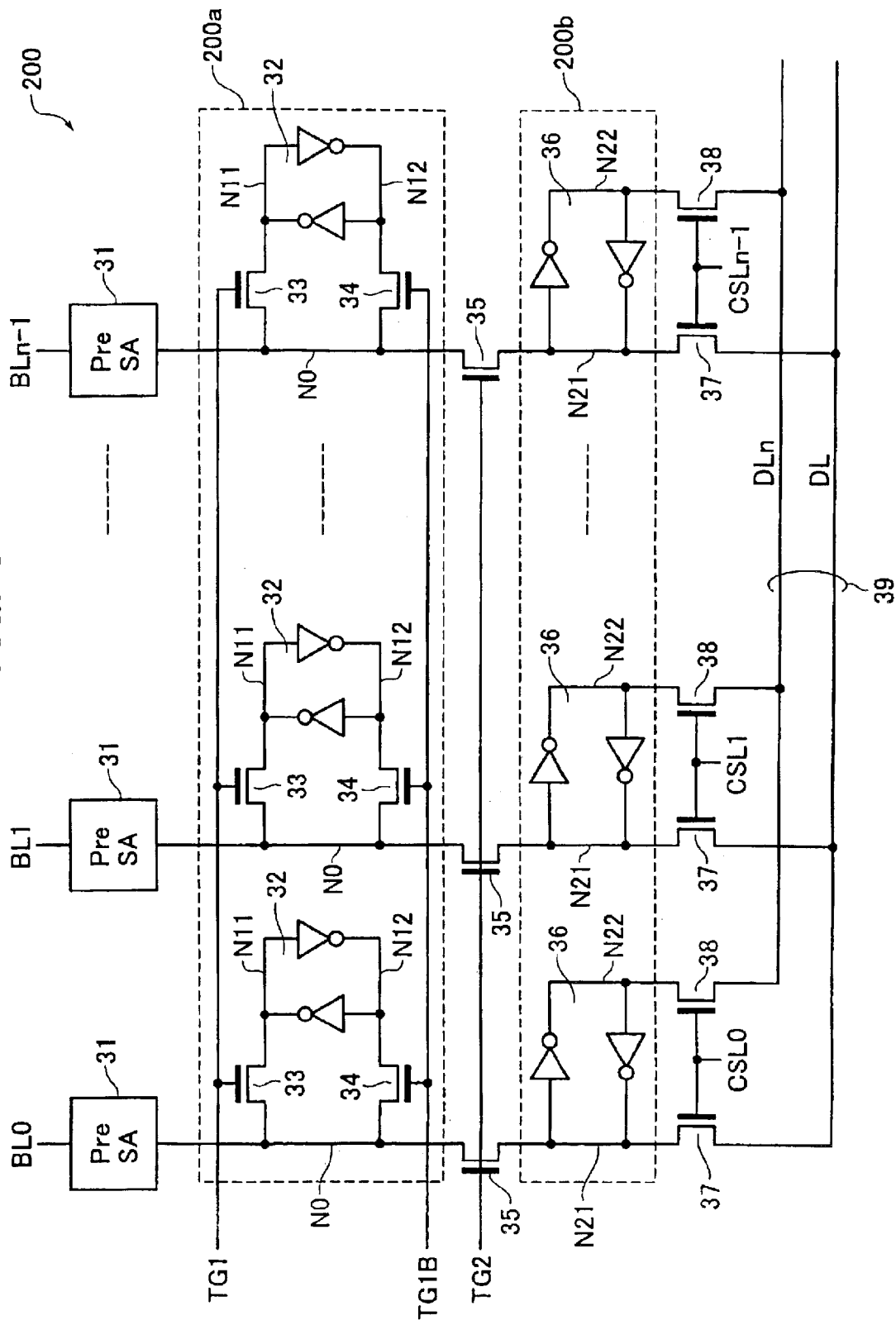
FIG. 3 is a diagram showing a configuration of a read/write circuit of the embodiment 1.

FIG. 3 shows an arrangement example of the data read/write circuit 200 with respect to a range of n bit lines BL within a single page of the memory cell array 100. The read/write circuit 200 is arranged to have two page buffers 200a, 200b in order to execute a copy write operation which causes a write or program operation and a read operation with respect to the cell array to partially overlap each other. The first page buffer 200a is mainly used to hold write data and perform data writing into the memory cell array 100. The first page buffer 200a is equipped with latch circuits 32 in units of bit lines, wherein their nodes N11, N12 are selectively connected to sense nodes N0 through transfer gates 33, 34, which are selected by control signals TG1, TG1B. Each the sense node N0 is connected to a bit line BL through a pre-sense circuit 31, which also functions as a bit-line clamp circuit used for clamping a bitline voltage potential.

The second page buffer 200b includes latch circuits 36 in units of respective bit lines, wherein nodes N21 thereof are selectively connected to the respective sense nodes N0 via transfer gates 35 which are driven by a control signal TG2. Two nodes N21, N22 of each latch circuit 36 are commonly connected to paired input/output data lines (DL, DLn) 39 through column select gates 37, 38, respectively.

The second page buffer 200b is for use as a cache which temporarily holds write/read data therein. More specifically, during per-page data writing, the column gates 37, 38 are sequentially driven by column select lines CSL so that data bits that are serially transferred from the input/output buffer along the data line 39 are sequentially loaded into the latch circuits 36. These data bits loaded to the latch circuits 36 will then be transferred in parallel via the transfer gates 35 toward corresponding latch circuits 32 of the first page buffer 200a and then held therein. During data reading, the data read to the second page buffer 200b are transferred to the data line 39 through the column select gates 37, 38 sequentially driven by the column select lines CSL, and then output to the chip outside.

In this embodiment, the first page buffer 200a is used as a sense amplifier during a normal data read operation, which is not readout for copying purposes. In contrast to this, in a copy write operation, the second page buffer 200b is to be used as a sense amp which directly accommodates therein cell data of the memory cell array 100, in order to perform data reading in the state that the first page buffer 200a holds write data.

In FIG. 3, there is shown a specific range of the data read/write circuit 200, which is connected to a pair of data lines DL, DLn corresponding to a single input/output terminal I/O. For instance, if one page of the memory cell array 100 is 2 kB in length, then the bitline number of FIG. 3 is represented as n=2048 in the case where the input/output terminal number is eight (8). The data lines are eight pairs of ones provided.

Figure 4:
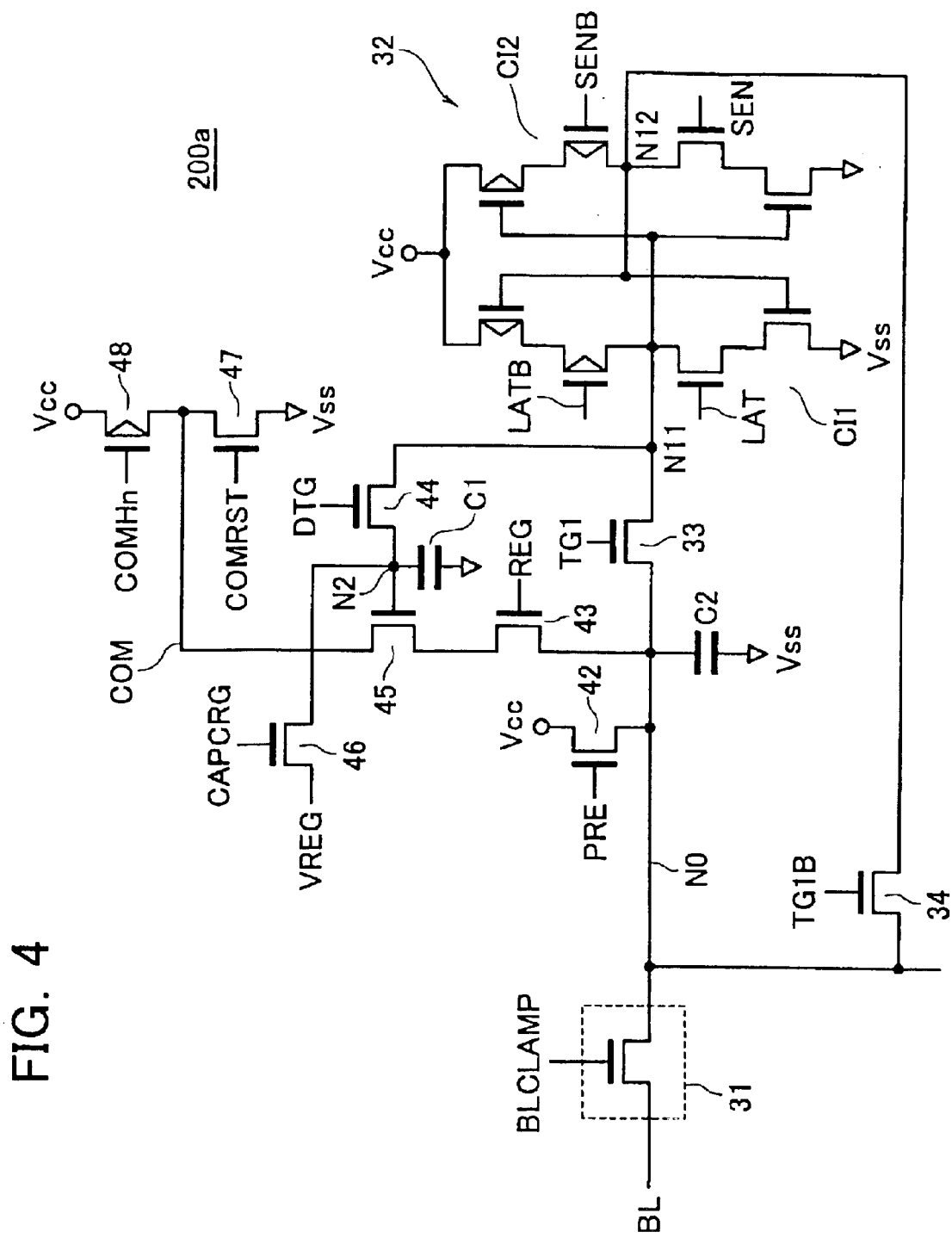
FIG. 4 is a diagram showing a detailed configuration of a first page buffer of FIG. 3.

Although the first page buffer 200a in FIG. 3 is shown in a simplified manner, circuitry required for per-bit verify operations is actually provided in order to perform repeated execution of write or program pulse application and verify-read operations at the time of a data write operation. FIG. 4 shows a unitary circuit configuration of the page buffer 200a, which also includes a circuit unit required for such verify operation. The latch circuit 32 shown herein is arranged so that clocked inverters CI1, CI2 are connected together in an inverse parallel or "antiparallel" fashion. The sense node N0 of FIG. 4 is connected through a transfer gate NMOS transistor 33 to a data hold node N11 of the latch circuit 32. A precharge-use NMOS transistor 42 is provided at the sense node N0; additionally, a capacitor C2 is connected thereto for holding precharged carriers.

The node N11 is connected through an NMOS transistor 44 that acts as a transfer switch element to the temporal storage node N2 which is used to temporarily store the data of node N11. Connected to this storage node N2 are an NMOS transistor 46 for charging a control voltage VREG to the node N2 and also a capacitor C1 for level hold purposes. The capacitor C1 is coupled to ground at its one end.

A common signal line COM is the one that is commonly provided in the data read/write circuit 200 of 1-byte data on a per-column basis, which line is connected to the sense node N0 through an NMOS transistor 45 which is a transfer switch element to be controlled by the node N2 and an NMOS transistor 43 that is a transfer switch element being controlled by a control signal REG. This common signal line COM is used as a Vcc power supply line for selective charge-up of the sense node N0 and also as a signal line for performing pass/fail judgment during write/erase-verify operations.

Figure 6:
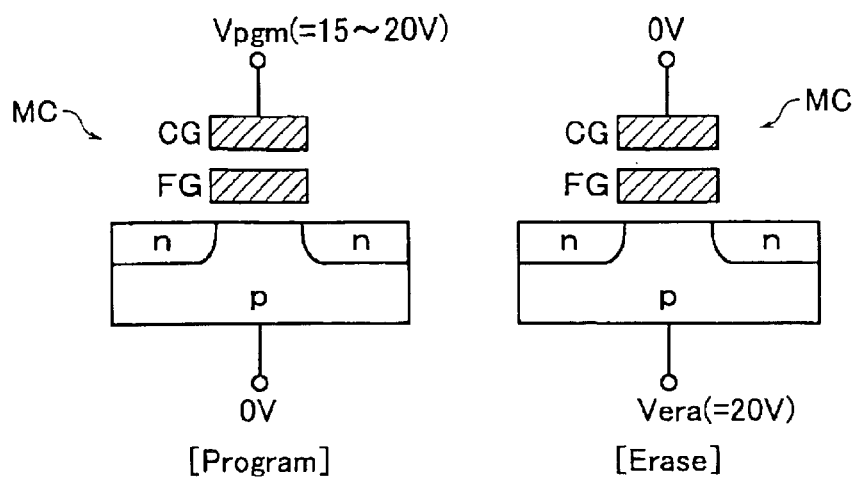
FIG. 6 is a diagram showing a memory cell structure along with write/erase principles.
Figure 8:
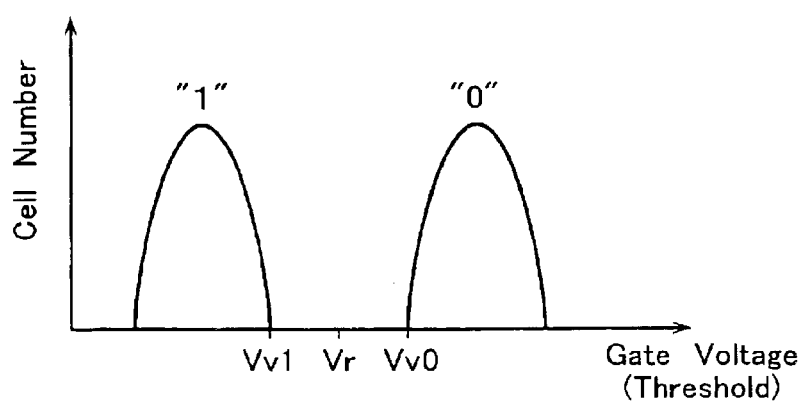
FIG. 8 is a diagram showing a threshold voltage distribution of data.

Write and write-verify operations using the page buffer 200a of FIG. 4 will be explained in brief below. As shown in FIG. 6, a memory cell MC used in this embodiment has a MOS transistor structure with a floating gate FG and a control gate CG stacked over the floating gate. This memory cell MC stores a bit data while letting a low threshold voltage state with electrons released out of the floating gate FG be an erased state (data "1") and also letting a high threshold state with electrons injected into the floating gate FG be a written or programmed state (data "0"). FIG. 8 shows a threshold voltage distribution of such data.

FIG. 6 shows the manner of voltage application during writing of a selected cell and the manner of voltage application during erasing. A write operation is performed by precharging through a bit line BL the channel of a selected cell to "L" or "H" level in accordance with data "0" or "1" and then giving a positive write or program voltage Vpgm to a selected word line. At a selected cell with "0" data given thereto, electrons are injected from the channel to the floating gate FG. In a non-selected or unselected cell with "1" data given thereto, the channel that becomes in an electrically floating state increases in potential due to its capacitive coupling with the control gate CG so that electron injection into the floating gate FG is prevented. Data erase is performed on a per-block basis in such a way as to set the control gate CG at 0V while applying an erase voltage Vera to a p-type well region, thereby causing the floating gate FG to discharge electrons therefrom.

Figure 7:
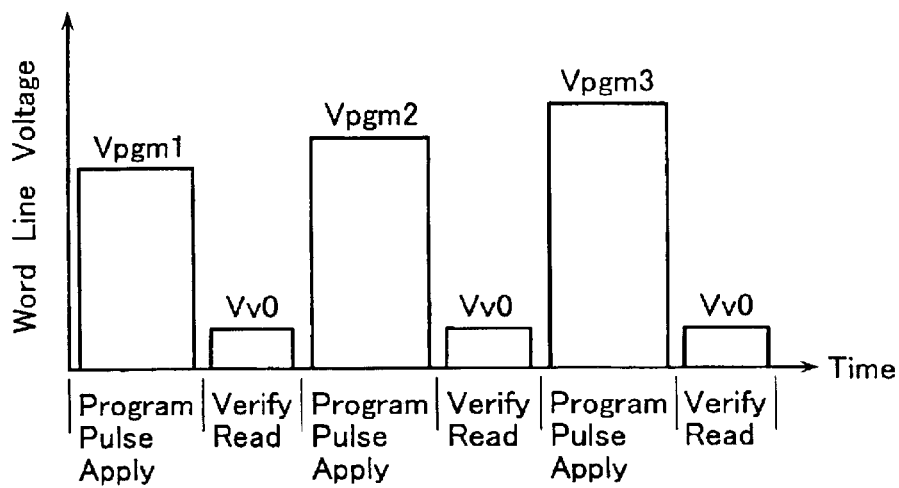
FIG. 7 is a diagram showing a word-line voltage waveform for explanation of the write operation principle.

In an actual write operation, application of the write pulse voltages Vpgm with sequentially increased potential values and verify-read are performed repeatedly as shown in FIG. 7. As shown in FIG. 8, a voltage which is given to a selected word line during verify-read is designed to have a carefully chosen value Vv0 that guarantees the threshold voltage distribution of "0" data. During write cycles, the page buffer 200a of FIG. 4 holds write data therein.

In FIG. 4, the write data is loaded in such a way that the node N11 of the latch circuit 32 becomes "L" or "H" in accordance with "0" or "1". The "1"data ("H" level) of the node N11 will be held until the write operation is ended by per-bit verify-read. Regarding "0" data, a readout bit line becomes "H" level at a time point that "0" write becomes sufficient; and then "H" level data is transferred to node N11 through sense node N0, resulting in the data being inverted.

Accordingly, write completion (verify pass) will be judged by detecting that the nodes N11 of all latch circuits 32 within the range to which parallel writing is performed become all "H"s.

Figure 5:
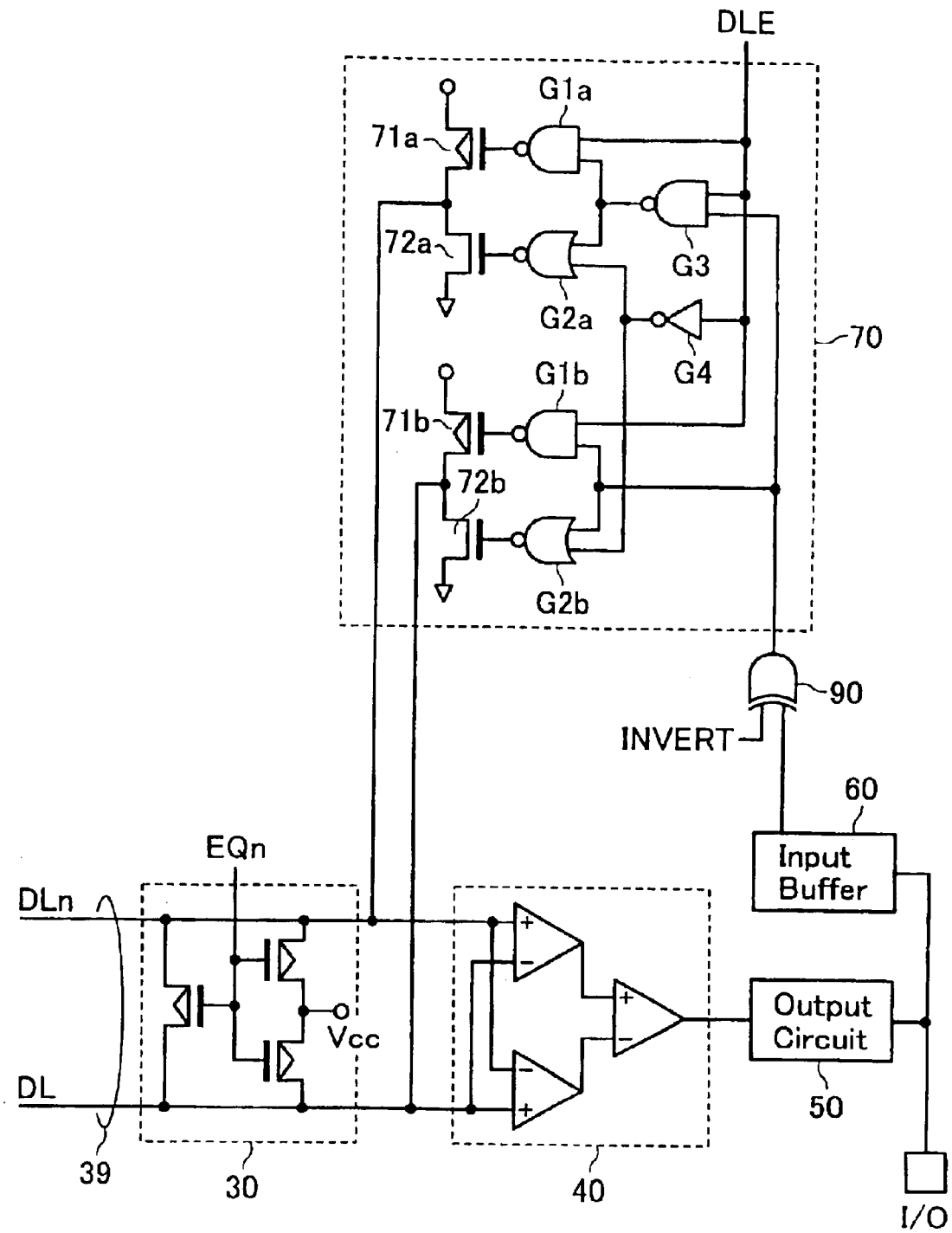
FIG. 5 is a diagram showing a configuration of a data input/output circuit unit of the embodiment 1.

FIG. 5 shows a configuration of the input/output buffer 230 with respect to a pair of data lines (DL, DLn) 39. A data-line sense amplifier 40 is connected to end portions of the data lines 39. A read output is inverted and amplified by this data-line sense amp 40 and then output to an input/output terminal I/O through an output circuit 50. Also connected to the data lines 39 is a data-line equalizer circuit 30 which is made up of PMOS transistors used to potentially equalize these lines at Vcc.

A data inversion circuit 90 is provided in a route on which write data is transferred to the read/write circuit 200 through an input buffer 60. More specifically, in the case of loading data to the second page buffer 200b, the write data will be sent forth from the input/output terminal I/O toward the data lines 39 through the input buffer 60 and also through the data inverter circuit 90—this circuit inverts a binary level when a need arises—and further via a data input circuit 70. Practically the data inversion in the inverter circuit 90 is performed in the case of adding data during copy write operations as will be explained later. During normal write operations, the data inverter circuit 90 transfers data without performing any level inversion.

The data inverter circuit 90 is an exclusive-OR gate: in the case where a signal INVERT is at "L", the data line DL is set at "H" when the data of input/output terminal I/O is "H"; thus, "H" is transferred to the node N21 of latch circuit 36 of the second page buffer 200a. In case the signal INVERT is "H", when the input/output terminal I/O's data is "H", the data line DL is set at "L" so that the node N21 of latch circuit 36 becomes "L". As described above, the data is transferred through the inverter circuit 90.

The data input circuit 70 is the one that is activated by a data load enable signal DLE for converting input data to complementary data and then transferring the data to data lines 39. The data input circuit 70 has two output drivers which are made up of PMOS transistors 71a, 71b and NMOS transistors 72a, 72b in a way corresponding to the data lines DLn and DL respectively. In order to control these drivers in accordance with an output of the data inverter circuit 90, logic gates G1a, G2a, G1b, G2b, G3, G4 are provided. Although a detailed explanation is eliminated herein, when the output of data inverter circuit 90 is at "H", "H" and "L" are transferred to the data lines DL, DLn, respectively. When the enable signal DLE is at "L", the output drivers becomes a high output impedance state, in which all the transistors 71a, 71b, 72a, 72b turn off.

In a data write operation, initially load a page of write data into the second page buffer 200a; then, transfer the data toward the first page buffer 200a. In the case of a normal data write operation, data input is performed while letting the control signal INVERT of the data inverter circuit 90 be set at "L". Accordingly, in the case of "1" data writing, a "H" data is input to the node N21 of latch circuit 36 of the second page buffer 200b: this will be transferred to the node N11 of latch circuit 32 of the first page buffer 200a through the transfer gate 35. This page buffer transfers a voltage potential of about Vcc to a corresponding bit line. In this case, when giving the write pulse Vpgm to a selected word line, the results is "1" write (i.e., write inhibit) in which any threshold voltage shift does not occur. On the contrary, in the case of "0" data writing, a "L" data is input to the node N11 of latch circuit 32. This page buffer transfers 0V to a bit line. Thus, when giving the write pulse Vpgm to a selected word line, "0" writing is done which causes the threshold voltage of a "1" cell in its negative threshold state to shift due to Fowler-Nordheim (FN) tunneling injection.

Figure 15:
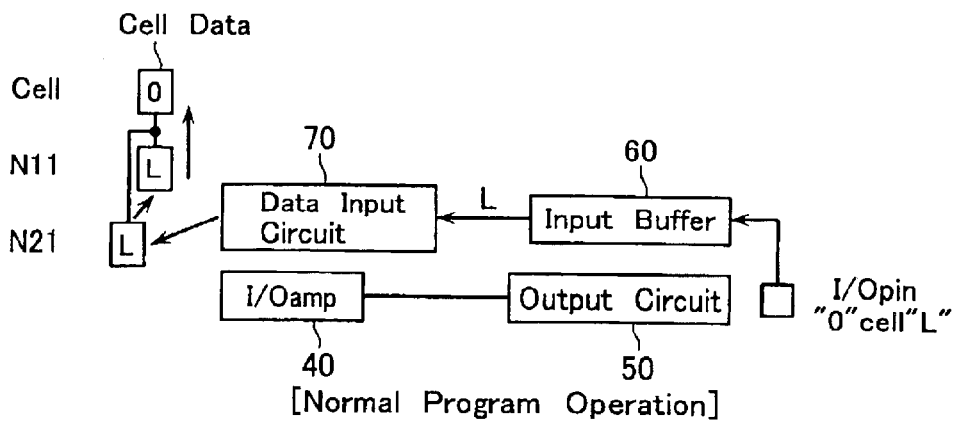
FIG. 15 is a diagram showing the way of data transfer during a normal write operation.

FIG. 15 shows a data flow in the case of write data "0" during the normal data write operation. By a "0" data ("L" level) input from the input/output terminal I/O, "L" level is transferred to the node N21 of latch circuit 36; further, the "L" level is sent to the node N11 of latch circuit 32, whereby "0" writing is done at a selected cell.

Figure 16:
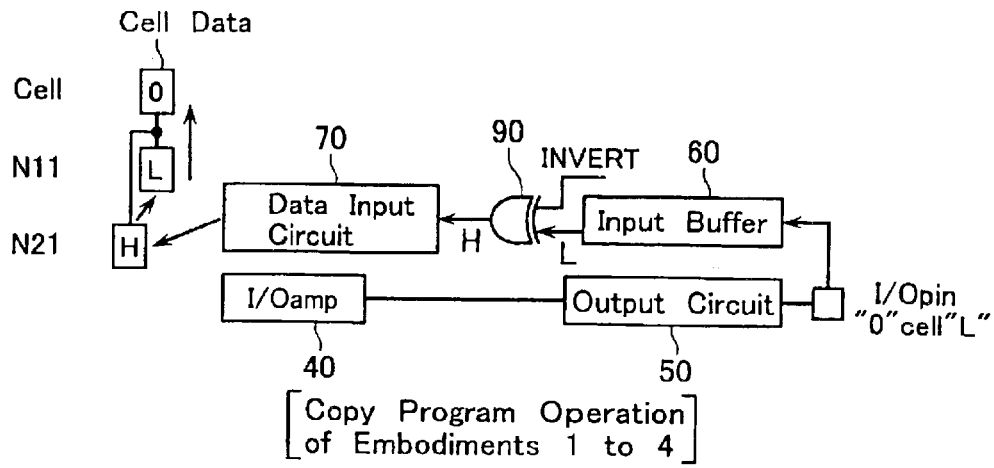
FIG. 16 is a diagram showing the way of data transfer of the copy write operations in the embodiments 1 to 4.

In contrast, in the copy write operation in this embodiment, as shown in FIG. 16, it is required to perform level inversion of a page of data read to the node N21 of latch circuit 36 and then transfer the data to the node N11 of latch circuit 32. The reason of this is as follows. Although, in cell data reading, "0" data is read to the node N11 (or the node N21 of latch circuit 36) as "H", the latch circuit 32's node N11 must hold the write data as "L" in order to achieve "0" data writing.

In this way, it is required that in the copy write operation, level inversion is done during data transfer from the node N21 of latch circuit 36 to the node N11 of latch circuit 32. Due to this, in the case of adding data from the input/output terminal in order to partly modify or change the copy write data, the level inversion at the data inverter circuit 90 is required. More specifically as shown in FIG. 16, when externally incoming additional or extra data is "0"(="L"), let this data be inverted to "H" data at the data inverter circuit 90; then, load the resultant data to the node N21.

A copy write operation (page copy operation) in this embodiment will next be explained below. This copy write operation is principally based on an operation which includes the steps of reading cell data of a certain page of the memory cell array 100 into the data read/write circuit, externally transferring and outputting the read data, performing testing of the data, adding data if necessary, and writing to another page of the memory cell array 100. The copy write operation in this embodiment is specifically arranged so that a data read operation from the memory cell array 100 and a data write operation of such read data into another page of the same memory cell array 100 partially overlap each other. Practically in this embodiment, during a data writing operation, let a cell data read operation of the next copy source page thrust or "wedge" itself into the data write operation. In other words, the cell data read operation interrupts the data write operation.

The data read operation contains readout (that is, read operation of a narrow sense) from the memory cell array 100 to the data read/write circuit 200 and a read data transfer/output operation of from the data read/program circuit 200 to external input/output terminals. As the read operation of narrow sense and the data write operation cannot be executed simultaneously, the interruption of the read operation results in halt or suspension of the data write operation into the cell array. The data output operation of from the data read/write circuit to the input/output terminals may be executed in a way parallel with a restarted data write operation. Thus it is possible to achieve speedup or acceleration when continuously performing a series of copying operations of a plurality of pages.

Figure 9:
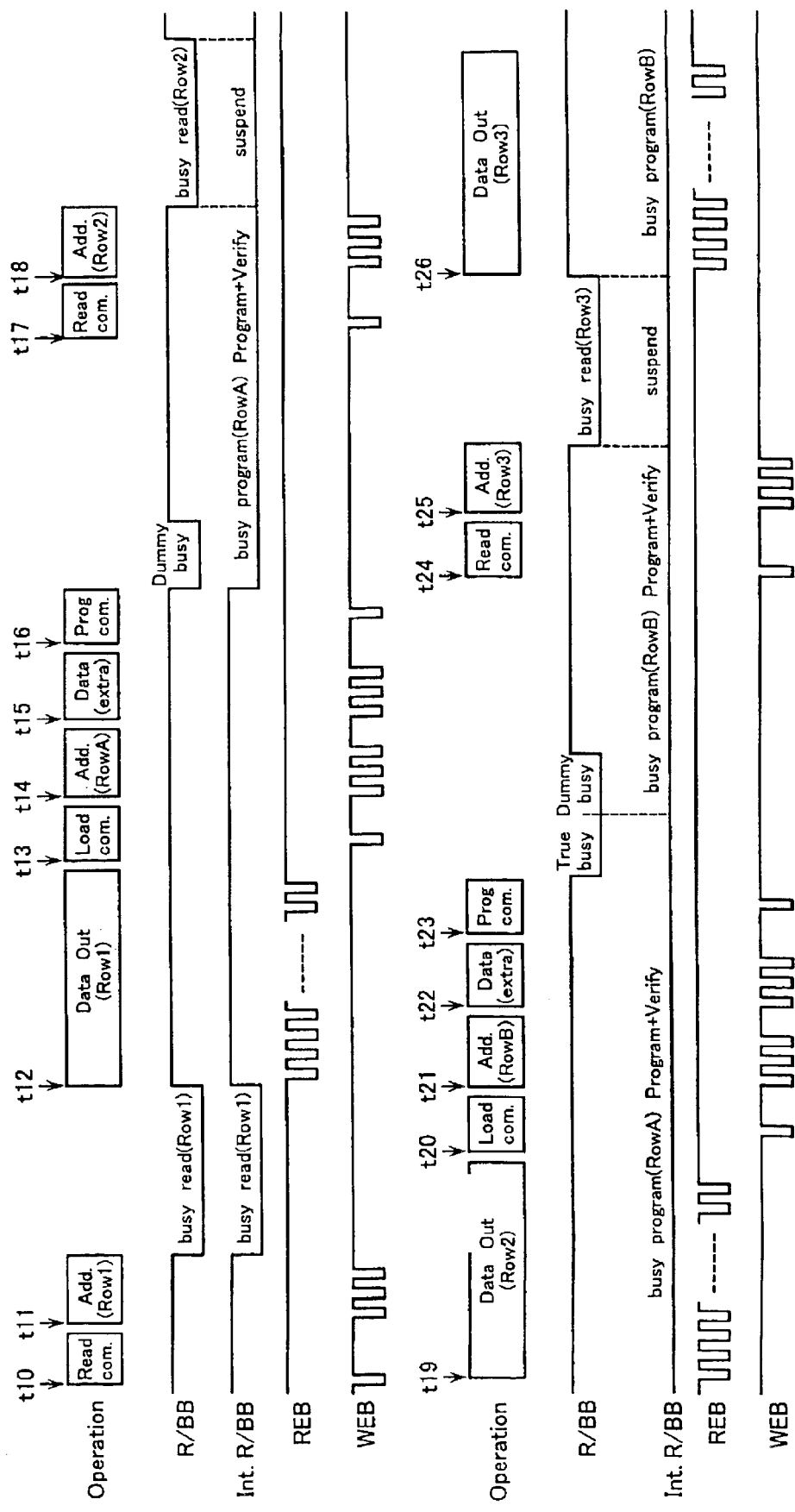
FIG. 9 is a timing diagram of copy write or program control of the embodiment 1.

FIG. 9 is a page copy operation timing diagram of this embodiment. Its lateral axis is the time and indicates the operation content "Operation" at two lines of the drawing sheet, along with a ready/bust state signal R/BB which is acknowledged by the status register 210 to the chip outside, a ready/busy state signal "Int. R/BB" which is internally output by the status register 190 only within the chip, a read enable signal REB, and a write enable signal WEB.

A read operation, a load operation which loads write data into the data read/write circuit, and a write operation which writes or programs data from the data read/write circuit into the cell array are performed upon receipt of input of commands for startup of respective operations-that is, inputting of a read command "Read com.", a load command "Load com.", and a write command "Prog. com." and also inputting of an address "Add.". These command input and address input are done in a way synchronized with "L" of write enable signal WEB. In FIG. 9, R/BB="L" indicates an external busy state, and Int.R/BB="L" indicates an internal busy state: within these time periods, read or write access is being executed with respect to the cell array. "Data Out" indicates a data output operation in which read data held in the page buffer are serially transferred and output toward the input/output terminals.

A detailed explanation of the page copy operation of FIG. 9 is as follows. A cell data read operation is executed upon receipt of input (at time point t10) of a read command, address input (time t11) which designates the address Row1 of a copy source page (read page). The read command at this time may be a normal read operation command or alternatively a read command for exclusive use during copying sessions. During data read from the cell array, the status register 210 outputs R/BB="μL" (busy read) and the status register 190 outputs Int.R/BB="L" (busy read) within the chip.

Figure 14:
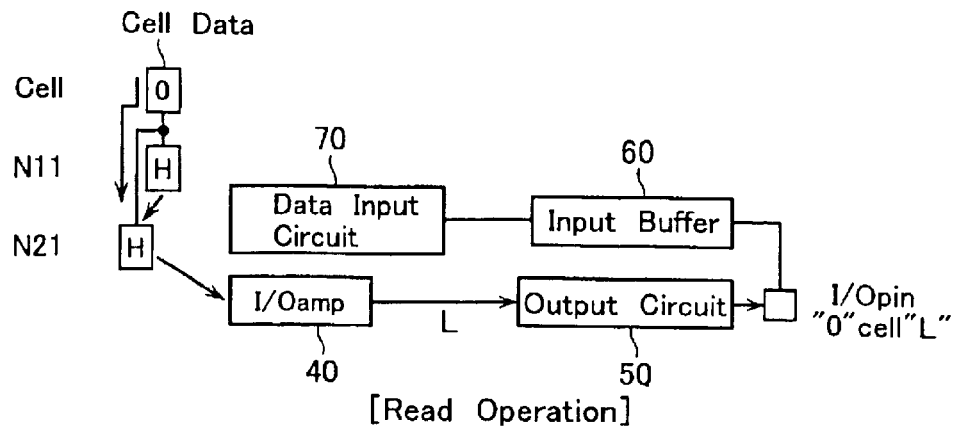
FIG. 14 is a diagram showing how data transfer is done during data reading for normal data readout and copy purposes.

The read operation at this time becomes a data transfer operation such as shown in FIG. 14. In a normal read operation, after having temporarily read the data of a memory cell to the node N11 of latch circuit 32 of the first page buffer 200a, transfer it toward the node N21 of latch circuit 36 of the second page buffer 200b. In contrast, in the case of a copy-dedicated read operation, directly read the cell data to the node N21 of latch circuit 36 of the second page buffer 200b.

Figure 17:
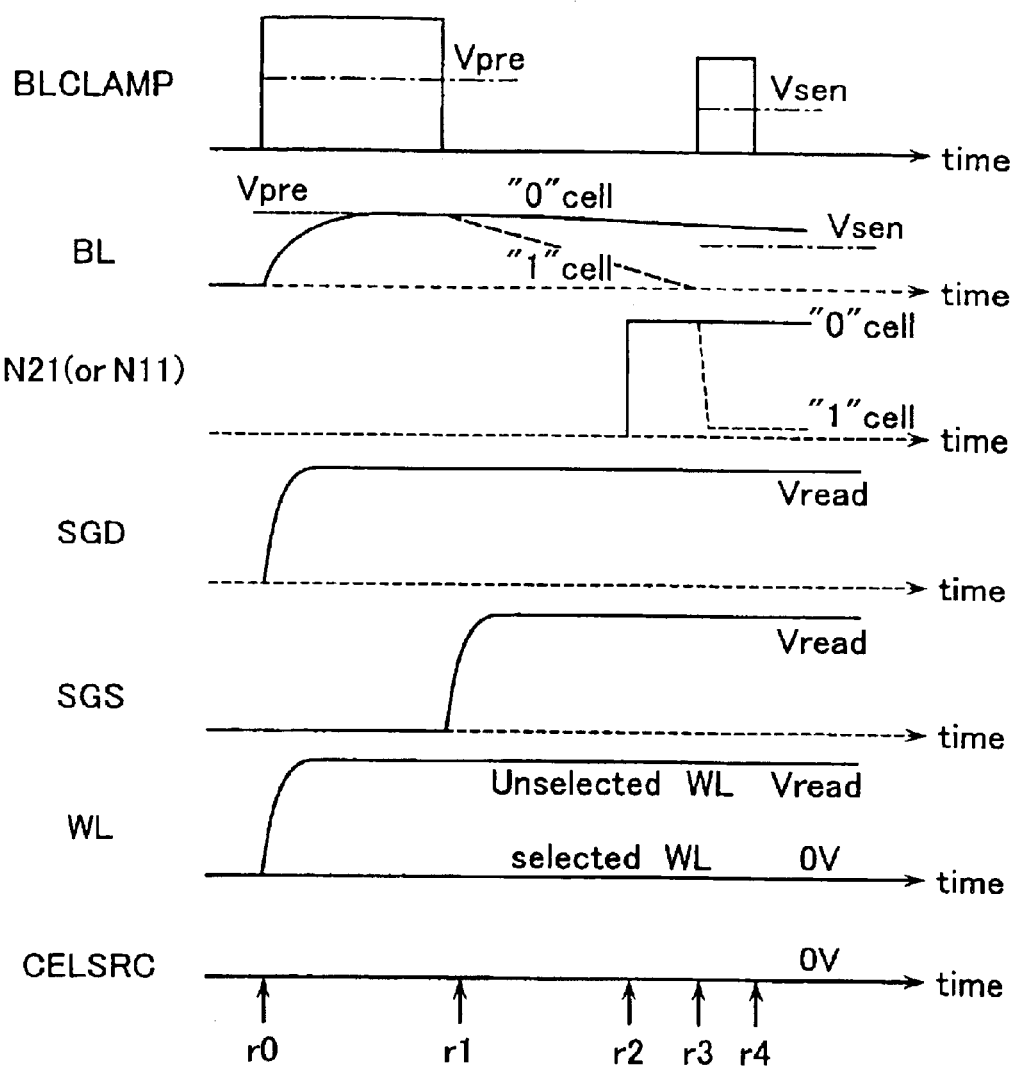
FIG. 17 is a diagram showing voltage waveforms during data reading in the embodiments 1–4.

In the example of FIG. 14, the selected cell is a "0" cell, with "H" level being read to the node N21. A waveform diagram in this read event is shown in FIG. 17. At time point r0, apply a 0V voltage to a selected word line, apply a pass voltage Vread (approximately 4V) to non-selected word lines within a NAND cell, and apply a pass voltage Vread (about 4V) to the select gate line SGD on the bitline side. In this state, apply an "H" level voltage for bitline precharge use to a control terminal BLCLAMP of a clamping transistor 31, whereby a selected bit line is precharged to a precharge level Vpre, from the page buffer 200a. When at time point r1 applying a pass voltage Vread (about 4V) to the select gate line SGS on the source line (CELSRC) side, a cell current flows due to a selected memory cell having its control gate to which a read voltage of 0V is applied. If the selected cell is a "0" cell, the threshold voltage is positive so that a change of a bitline potential stays less as indicated by solid line in FIG. 17. If it is a "1" cell, a large cell current flows to discharge the bit line; thus, the bitline potential decreases as indicated by broken line.

After having precharged the sense node N0 to Vcc at time point r2, apply again a sense-use voltage to the control terminal BLCLAMP at time point r3 to thereby sense a bitline potential. At this time, if the bit line's potential is higher than the level of Vsen, then the node N21 (or N11) becomes "H". In other words, in the case of a "0" cell, "H" is read out to node N21 (or N11). The "H" of this node N21 is inverted on a data output route and is then output to I/O terminal as "L".

In FIG. 9, a serial output operation of the data read into the page buffer 200b toward the input/output terminals is shown as an operation "Data Out" which gets started at time point t12. An operation for output of a page of read data is performed as serial transfer of a plurality of bits at a time, in synchronism with read enable signal REB. The data read out to the chip outside is taken into the memory controller, and error check is done. The data of the page address Row1 will be copy-written or programmed into a different page address by the following operation. For this page writing, after having input a load command (at time point t13) and also input an address which designates the address RowA of a write destination (at time t14), write data "Data(extra)" for correction of the read data is input (at time t15). Thereafter, a write command for execution of copy writing is input (at time t16).

It should be noted here that a page of data for copy writing is obtained in such a manner that the read data being held at the node N21 of latch circuit 36 is inverted in level and then transferred to the node N11 of latch circuit 32 as stated previously. Therefore, when inputting additional or extra data for modifying part of the data as a result of testing outside the chip, it becomes necessary to level-invert this within the chip and then load it to the node N21 of latch circuit 36. More specifically, the write data input from the external is level-inverted at the inverter circuit 90 while letting the control signal INVERT be at "H" and then loaded to the node N21 as shown in FIG. 16.

When a copy write command is input, invert and transfer the data of the node N21 of latch circuit 36 to the node N11 of latch circuit 32 in such a way as to provide correct write data for memory cells. More specifically, in FIG. 3, perform data transfer while setting the control signals TG2 and TG1B at "H" level: in the event that the node N21 is at "H", perform inversion transfer so that the node N11 becomes "L".

Additionally, in such a case that the extra data is supplied to the chip after "0", "1" level thereof are inverted within the memory controller outside the chip, make the data inverter circuit 90 inactive (INVERT="L") and then perform data loading in a similar way to that of the normal data writing shown in FIG. 15.

As soon as the data transfer to the latch circuit 32 is completed, start a write pulse application operation. After completion of the write data transfer, the data of the second page buffer 200b becomes unnecessary. Then, in order to effectively use the latch circuit 36 of second page buffer 200b, let it be in a command acceptable state by setting R/BB="H" (ready) after establishment of a short busy (dummy busy) state for the outside even though a write operation is being executed (busy) within the chip.

Although a normal write operation time is on the order of from 200 to 300 μs, it is important here to let it be dummy busy, which is as short as about several μs. In such a case that the copy operation is the movement of a plurality of pages of data, read and write will be repeated on a per-page basis. In this embodiment, during execution of a copy write operation to the page address RowA, perform read command input (at time point t17) and address input (at time t18) with respect to the page address Row2 of the next copy source.

Figure 19:
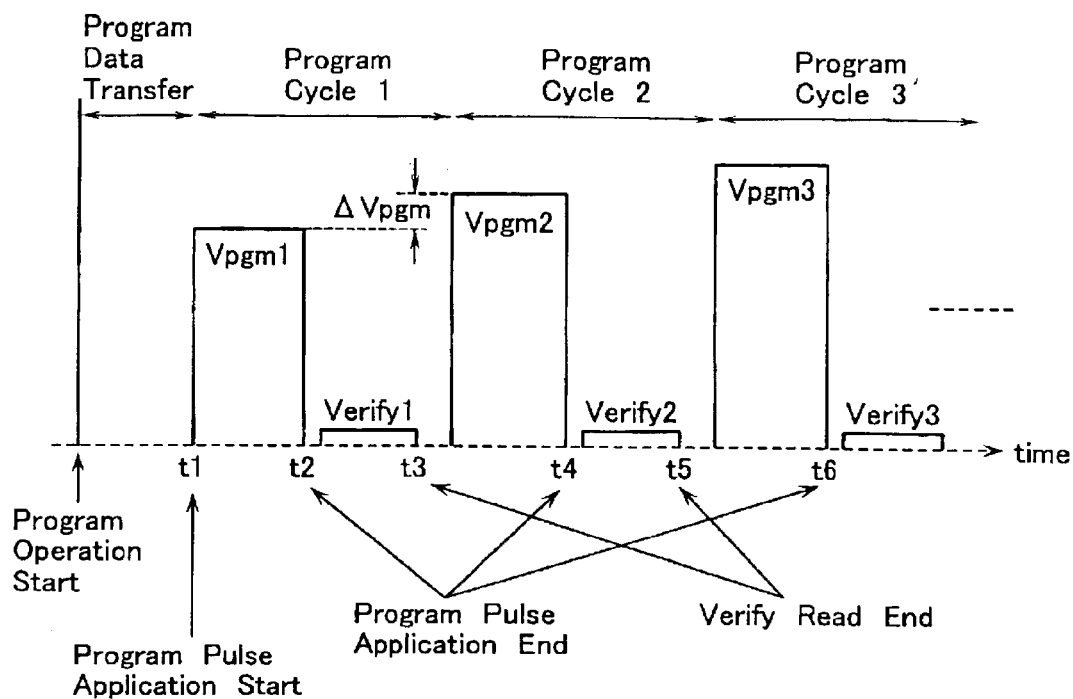
FIG. 19 is a diagram for explanation of interruption of a read operation into a write cycle in the embodiment 1.

Within the chip, sequence control is done by the control circuit 110, whereby the write operation is performed between the latch circuits 32 of page buffer 200a and the memory cells so that a write cycle which repeats the above-stated write pulse application and verify-read is in progress; however, interruption processing is possible after the write pulse application operation and also after the write-verify or "program-verify" operation. More specifically, the data being presently written is statically held in the latch circuit 32, which is electrically separated and disconnected by the NMOS transistors 33 and 34 from the sense node N0 and latch circuit 36. Accordingly, if the write pulse application is being performed in the write cycle such as shown in FIG. 19, then permit interruption of a read operation while waiting for any one of the time points t2, t4, t6, . . . at which such the write pulse application operation is ended. Alternatively, if the write verify-read operation is being presently performed, then permit interruption of the read operation at any one of the time points t3, t5, . . . at which such the verify-read operation ends.

In this way, it is possible to release bit lines for the read operation at the timing of switching the write pulse application operation and verify-read operation. A read operation of this interruption processing is to output a busy state toward the outside until its termination while halting or suspending any program operation during this process in a similar way to normal read operations. As soon as readout from the cell array is ended, set R/BB="H" (ready) and at the same time restart the once-stopped program operation. And, serially output to the chip outside the data of address Row2 as read into the page buffer 200b (at time point t19).

In the following procedure, in a similar way, check the read data of such copy source page outside the chip, and then perform copy writing of this data at page address RowB. More specifically, load command input (at time point t20), address input (at time t21), data input (time t22) and write command input (time t23) are performed to thereby perform data writing to the page address RowB.

Preferably the timing of permitting interruption or "wedging" of the read operation during a write cycle may be designed so that it is as early as possible-namely, the sooner, the better. In order to attain the effect of this operation, it is necessary to allow the serial output time as well as the command/address input and data load time to maximally overlap the busy time within the chip. With such overlap, in the second and its following copy write events, such a situation may be occurred that writing or "programming" is not yet completed within the chip when a write command is input.

In this case, if the presently executed writing is not ended, the system procedure cannot proceed to the next writing step; for this reason, the status register 210 is expected to generate and issue true busy (True busy) until the writing is completed. More specifically, even when inputting the address RowB of second copy write and loading extra data into the second page buffer 200b, it is impossible to set R/BB in the "H" (ready) state until such write data is transferred to the first page buffer 200a.

Upon completion of the writing of address RowA, a ready state is externally established which permits reading with respect to the next address Row3, after elapse of a dummy busy (Dummy busy) time period. Internally, a write cycle with respect to the address RowB is executed so that the busy state continues. In the following procedure, similar operations will be repeated.

Figure 10A:
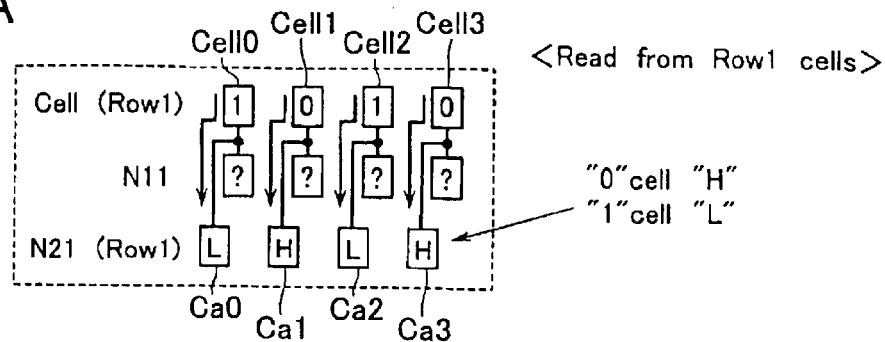
FIGS. 10A to 10H are diagrams each showing a data transition state of the copy write operation.
Figure 10B:
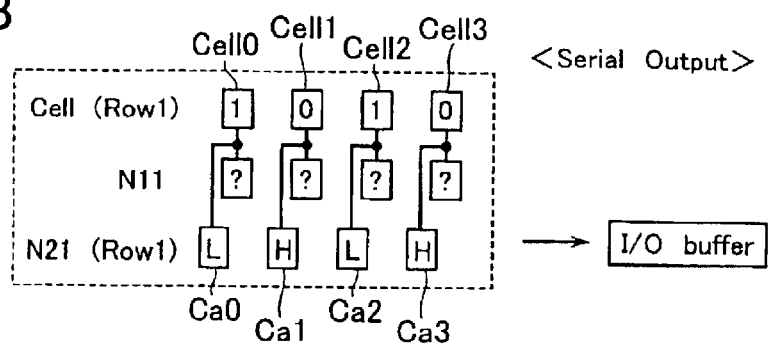
Figure 10C:
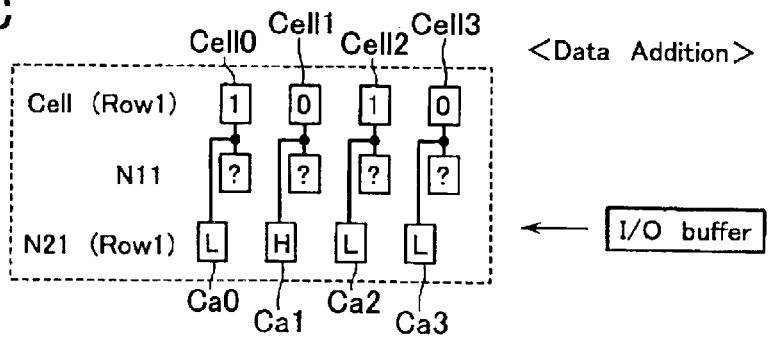

FIGS. 10A–10H show data transitions around the page buffer during the copy write operation up to here. In these drawings, the one with a page length of 4 bits is shown as an example. FIG. 10A indicates the way that the data bits "1", "0", "1", "0" of cells Cell0, Cell1, Cell2, Cell3 of the first page address Row1 of a copy source are read to the nodes N21 of the second page buffer 200b as cache data Ca0, Ca1, Ca2, Ca3 of "L", "H", "L", "H". The data read to the nodes N21 are serially transferred and then read out to the outside through the input/output buffer as shown in FIG. 10B. After completion of the read operation stated above, add extra data if necessary and then load them to the second page buffer 200b. FIG. 10C shows this process-here, it shows an example in which the read data bits that have been held at the nodes N21 of latch circuits 36 in the state of "L", "H", "L", "H" are partially rewritten and loaded as "L", "H", "L", "L".

Figure 10D:
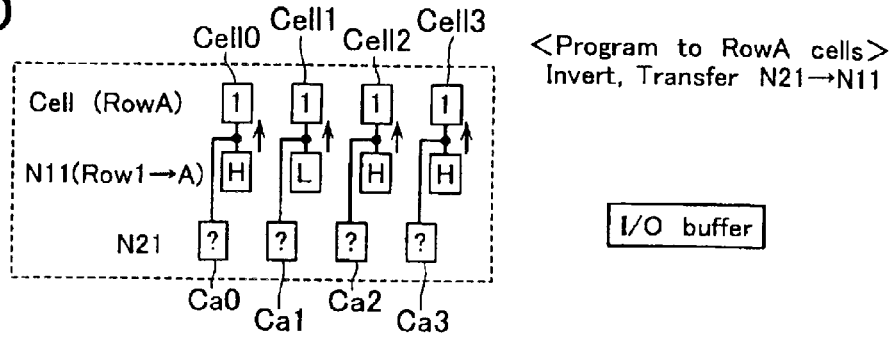
Figure 10E:
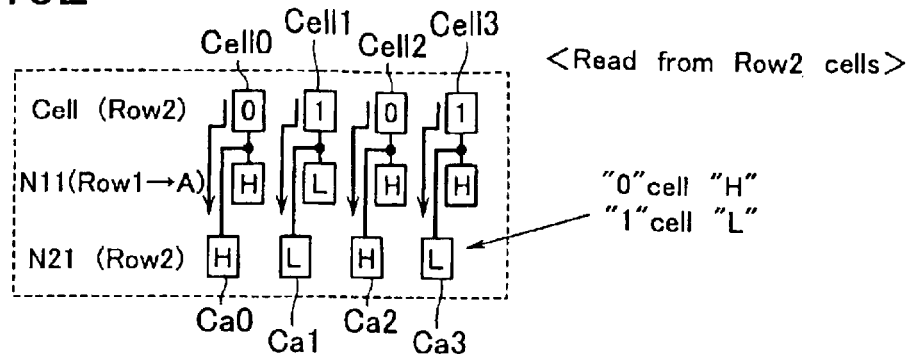

As shown in FIG. 10D, the data bits loaded to the nodes N21 of the second page buffer 200b are inverted in logic level and transferred as write data to the nodes N11 of first page buffer 200a and then written into the cells of address RowA of the copy destination. On the way of such write cycle, the write operation is suspended; then, reading of the page address Row2 which is the next copy source is carried out while holding the write data in the first page buffer 200a. This process is shown in FIG. 10E, wherein cell data are directly read out to the nodes N21 of the second page buffer 200b. Here, an example is shown in which read data bits are "H", "L", "H", "L".

Figure 10F:
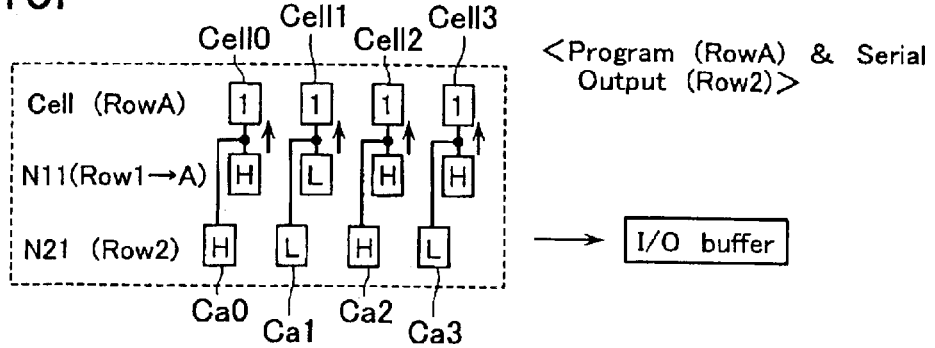

And, as shown in FIG. 10F, while the data as read to the nodes N21 are serially transferred and output to the outside, data writing to the cells of the address RowA is restarted by use of the write data of nodes N11. More specifically here, when looking at from the chip outside, the read operation and the write operation overlap each other. Although the write operation is the one that uses the data "H", "L", "H", "H" of the nodes N11 to write "1", "0", "1", "1" into the cells Cell0, Cell1, Cell2, Cell3 of the address RowA, FIG. 10F shows that the cell Cell1 stays at "1" and that the writing is not completed yet.

Figure 10G:
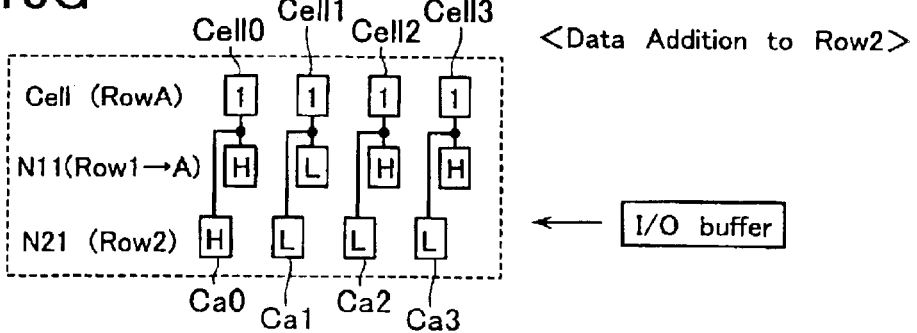

After data read of the address Row2 is ended, input modified write data if necessary in a similar way to that relative to the previous page; then, as shown in FIG. 10G, the read data held in the second page buffer 200b is rewritten. Until the data writing into the cells using the write data of the first page buffer 200a is completed, it is not permitted to transfer the data of second page buffer 200b toward first page buffer 200a.

Figure 10H:
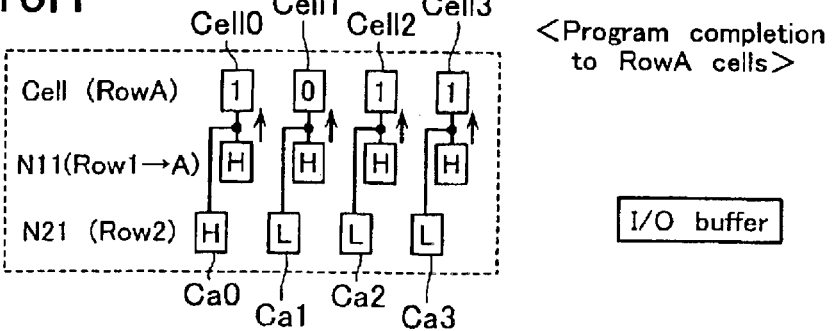

FIG. 10H shows the state that the writing of "1", "0", "1", "1" into the cells Cell0, Cell1, Cell2, Cell3 of the address RowA by the data "H", "L", "H", "H" of the nodes N11 is completed. More specifically, the node N11 which has held "L" inverts as a result of verify-read so that the nodes N11 of the first page buffer 200a become all "H"s. In the following procedure, the data of the nodes N21 of second page buffer 200b are inverted and transferred to the nodes N11 of first page buffer 200a, and writing to the address RowB which is a copy destination will be performed in a similar way.

In the operations stated up to here, during the write cycle with respect to the page address RowA, a read operation with respect to another page address Row2 is forced to interrupt the write cycle; thus, it is required to store the write page address RowA of the write cycle being suspended. To do this, as shown in FIG. 1, two systems of row address registers 160, 165 are prepared. Switching between these row address registers 160, 165 may be done in a way which follows.

Store a write address in the row address register 165. During a write operation, drive a row address selector switch 172 to turn on, thereby outputting the write address from this row address register 165 toward the row decoder 120. A read address which is used for a read operation of the interrupt processing is stored in the row address register 160. At the timing which permits interruption of the read operation, let the row address selector switch 172 turn off while letting a selector switch 171 turn on, thus outputting a read-use address to the row decoder 120. As soon as the read operation ends, change over the switches 171 and 172 in such a way as to again output the write-use row address to the row decoder 120.

In the prior art, when the copy source's cell data read time is set at 25 μsec, the data writing time is 200 μsec, the page length is 2 kB, and the cycle of serial output of read data toward the chip outside is 50 nsec, the transfer rate becomes 6.2 MB/sec. In contrast, in this embodiment, the copy write operation time is effectively shortened because the serial output time, 50 nsec×2k=100 μsec, of the copy source's read data toward the chip outside overlaps the writing time. In particular, when continuously performing copy write operations for a plurality of pages, the write transfer rate may be improved up to about 9 MB/sec.

[Embodiment 2]

In the operation control of the embodiment 1, in the case of starting copy programming, the pulse application operation gets started immediately after the data transfer from the latch circuits 36 of the second page buffer 200b toward the latch circuits 32 of the first page buffer 200a. Due to this, it was required to employ specific processing for permitting interruption of the cell data read of the next copy source at the switching timing of a write pulse application operation and a write-verify operation. This means that although certain degree of freedom relating to timing issues is present, a wait time generates between the actual read operation and the receipt of the read command. Therefore, the busy state is undesirably continued for a lengthened time which becomes equivalent in maximum to a read busy time plus a single write pulse application time or alternatively becomes a read busy time plus a write verify operation time. The result of this is that if accurate detection of the busy time of an interrupted or "wedged" read operation is failed, a time loss takes place until serial output gets started.

Figure 11:
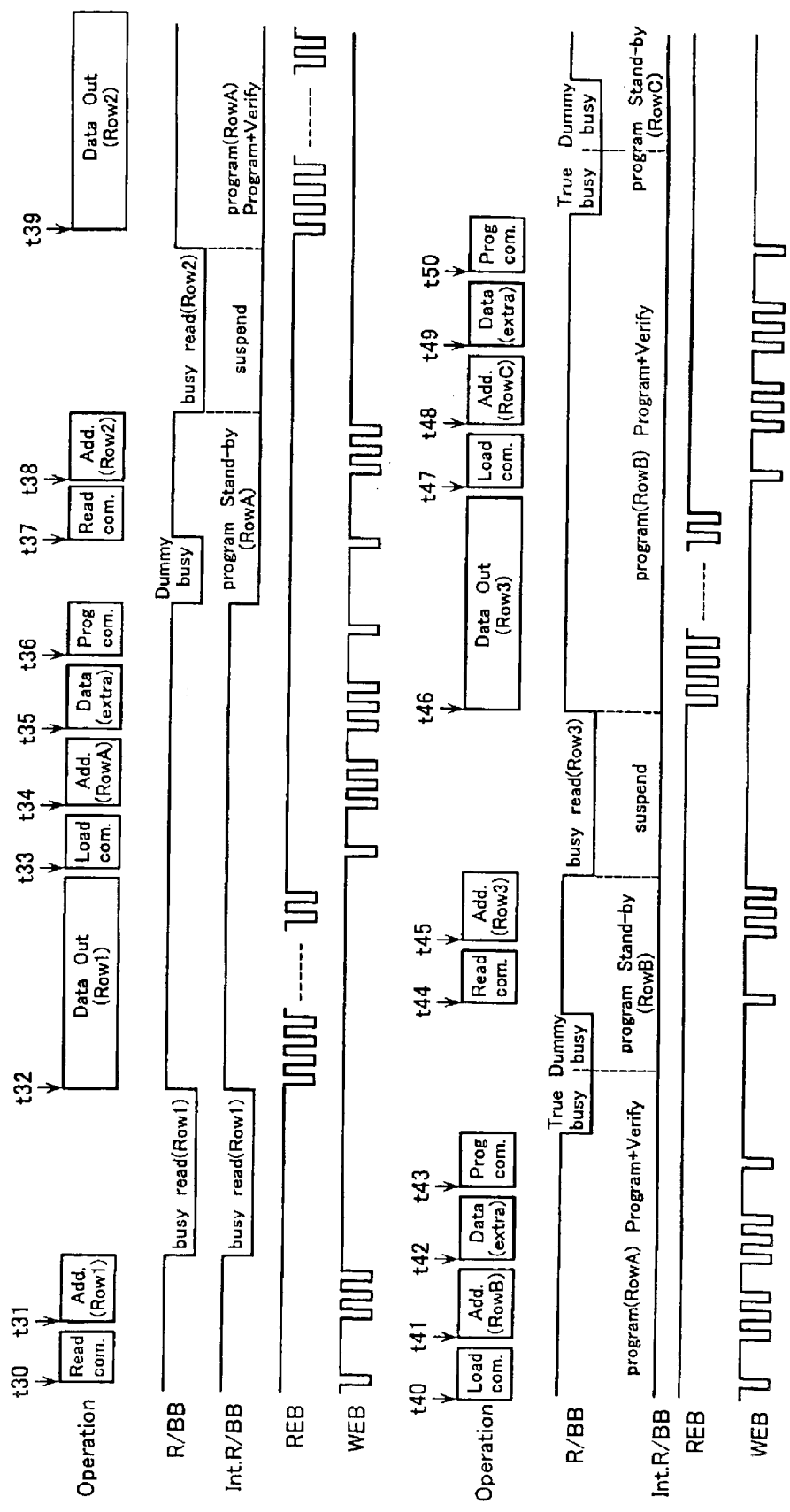
FIG. 11 is a timing diagram of copy write control of an embodiment 2.

In contrast, in the embodiment 2, a write pulse application is not performed immediately after having loaded write data; instead, an idle time or a clearance time is set up for waiting for the following data read operation with respect to the next copy source. An operation timing diagram of the embodiment 2 thus arranged is shown in FIG. 11 in a way corresponding to FIG. 9.

Similarly to the previous embodiment, upon receipt of read command input (at time point t30) and address input (at time t31), an operation is executed to read data of the address Row1 of a copy source. The data read out of the cell array into a page buffer will thereafter be serially transferred, and then output to the chip outside (time t32). To write or program the read data into the page address RowA of a copy destination, load command input (at time t33), address input (time t34), additional or extra data load (time t35) and write command input (time t36) follow consecutively. The procedure up to here is similar to that of the previous embodiment.

In this embodiment 2, it does not proceed to the pulse application operation immediately after having sent the write data from the second page buffer 200b to the first page buffer 200a; instead, an idle time period is provided for establishment of a write standby state and for waiting for a cell data read command of the next copy source page. When within the idle or "wait" period there are read command input (at time point t37) and address input (time t38) with respect to the address Row2 of the next copy source page, execute data reading. During data read from the cell array, the execution of a writing operation is not possible; thus, during such period, any data write operation is stopped or halted. This is typical operation control which assumes achievement of continuous page copy operations.

With such an arrangement, the busy state of a read operation of the address Row2 after write command input with respect to the address RowA gets back, without fail, to a ready state with consumption of the time of a normal cell data read operation. Accordingly, design complexities are much reduced due to the fact that any interruption does not occur at an optional timing during a write cycle. As shown in FIG. 11, after the data read operation (busy state) from the cell array is ended, a write operation to the address RowA gets started simultaneously when such read data's serial output starts (at time t39).

And, during a write cycle with respect to the address RowA, there are performed load command input (at time point t40), address input (at time t41), data load (time t42) and write command input (time t43) for the purpose of copy writing of the read data of address Row2 into an address RowB. When the write cycle relating to address RowA is ended, a write standby state is set. And during such standby period, after setup of a fixed dummy busy state, reading is executed in a way responsive to receipt of read command input (at time point t44) and address input (at time t45) with respect to the next copy source address Row3. Similarly to the previous page copy operation, a write cycle relating to the address RowB gets started simultaneously upon startup of the read data's serial output operation (time t46). Hereafter, similar operations will be repeated.

It should be noted in this embodiment that if a restrictive condition is given which prevents any write operation from getting started internally unless a read command (Read com.) is input after input of a write command (Prog. com.), a delay of read command input leads to a significant decrease of the transfer rate. Thus it is preferable that the idle time period for write standby is preset to have a fixed length of time period. More specifically, whenever a read command is input within the idle period, suspend or halt a write operation until the termination of a read operation from the cell array; start a write cycle automatically in the event that any read command input is absent within the idle period. Thus it is possible to prevent unwanted occurrence of decrease of the transfer rate.

[Embodiment 3]

In the operation control of the embodiments 1–2, it is necessary to simultaneously hold at separate address registers both a row address (page address) for performing writing and another row address of data readout of the next copy source, and also required that the control circuit switch between them. In contrast, it is possible to provide such a control method as to permit a user or a controller to reinput addresses without the row address switching control within the chip.

Figure 12:
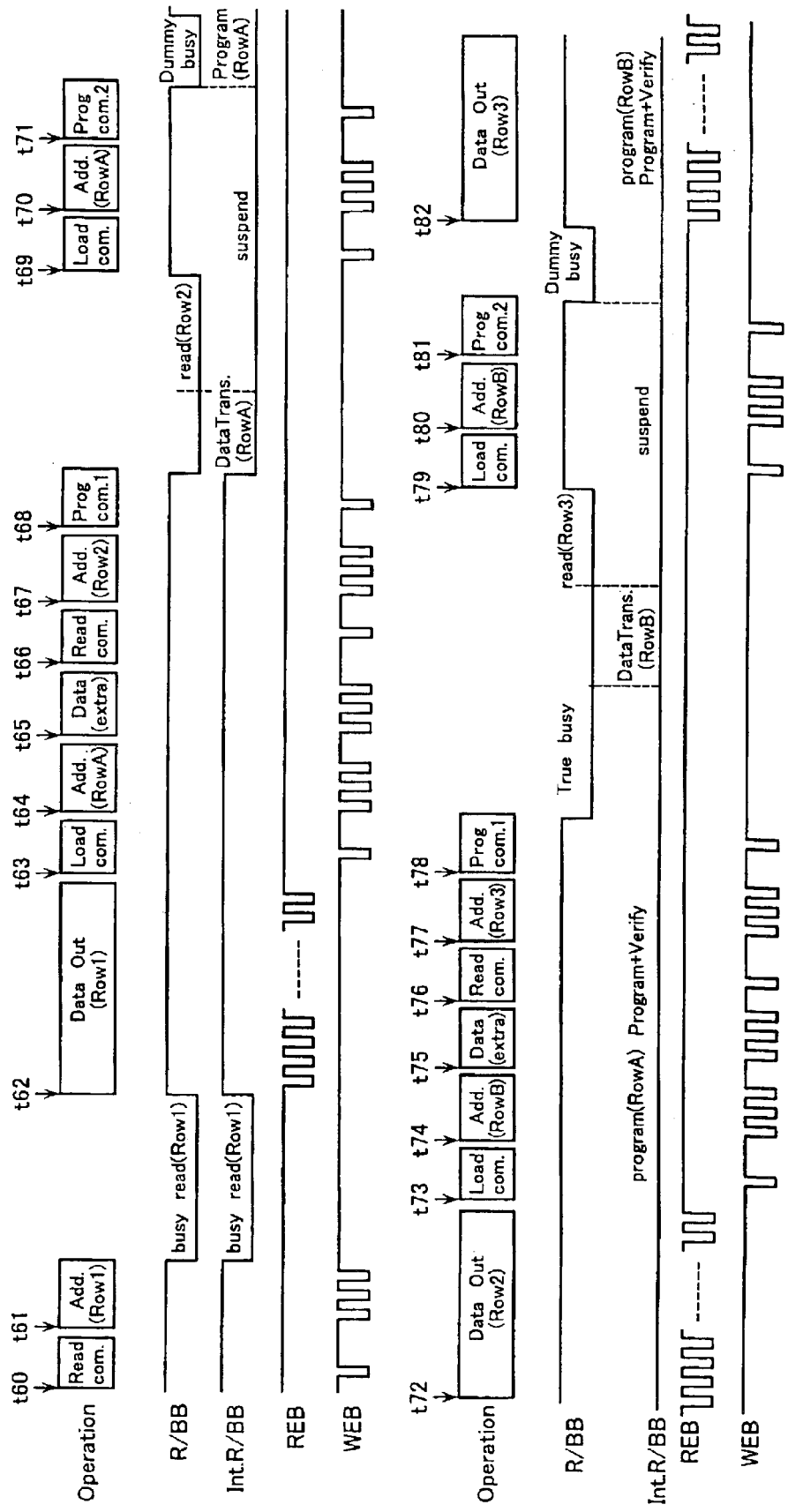
FIG. 12 is a timing diagram of copy write control of an embodiment 3.

FIG. 12 is a timing diagram of a copy write operation of such an embodiment. Here, the order of command/address inputs is made different from that of the previous embodiment 2 to thereby preclude the need for precise ready/busy control in the case where the input number of addresses and commands is increased. More specifically, data readout of an address Row1 of a first copy source is carried out by read command input (at time point t60) and address input (at time t61). After termination of the data read from the cell array to a page buffer, serial transfer of the read data from the page buffer toward the external output terminals is performed (time t62). After the above-noted read operation ends, load command input (at time t63) and address input (time t64) plus extra data input (time t65) follow consecutively, which are for execution of copy writing of the read data to address RowA. The operation up to here is similar to that of FIG. 11.

Although in the operation stated above the write destination row address RowA is formally input for the purpose of providing compatibility with normal load command schemes, this will be overwritten by a read command (at time point t66) and address input (time t67) with respect to the next copy source address Row2 to be input subsequently. To be brief, the formal address "RowA" which was first input to an address register is rewritten with and updated by the address "Row2."

Subsequently, when inputting a write command (Prog.com.1) at time point t68, data of the second page buffer 200b is inverted and transferred to the first page buffer 200a side; simultaneously, a read operation is performed with respect to "Row2" which is a read-use address. At this instant, the write data being presently held in the first page buffer 200a loses any row address. Then, after the data reading from the cell array is ended, perform load command input (at time point t69), address input (at time t70) and write command (Prog.com.2) input (at time t71) in order to write or program the already loaded data into the address RowA. These become inputs to be done again-i.e., reinputs. Whereby, writing of the hold data of the first page buffer 200a is executed within the chip. During writing to the address RowA of the cell array, the read data held in the second page buffer 200b will be serially output (at time point t72) in a similar way to that of the previous embodiments.

Similarly, after completion of the data read of the second copy source address Row2 also, load command input (at time point t73) and address input (time point t74) and also extra data input (time t75) are performed for writing to a copy destination write address RowB; thereafter, continuously perform read command input (at time t76) and address input (time t77) with respect to an address Row3 of the next copy source. Whereby, the write address RowB is overwritten by the read address Row3. Although the write command has been input at time point t78, the write operation to the address RowB is stopped after the write operation to the address RowA. And, after the read operation of address RowB is ended, again perform load command input (at time t79), write address RowB input (time t80) and write command input (time t81) for the purpose of copy writing into the address RowB.

In this embodiment thus arranged, the row address control becomes simplified because the content of a row address register is simply overwritten once at a time whenever a row address is input.

[Embodiment 4]

Figure 13:
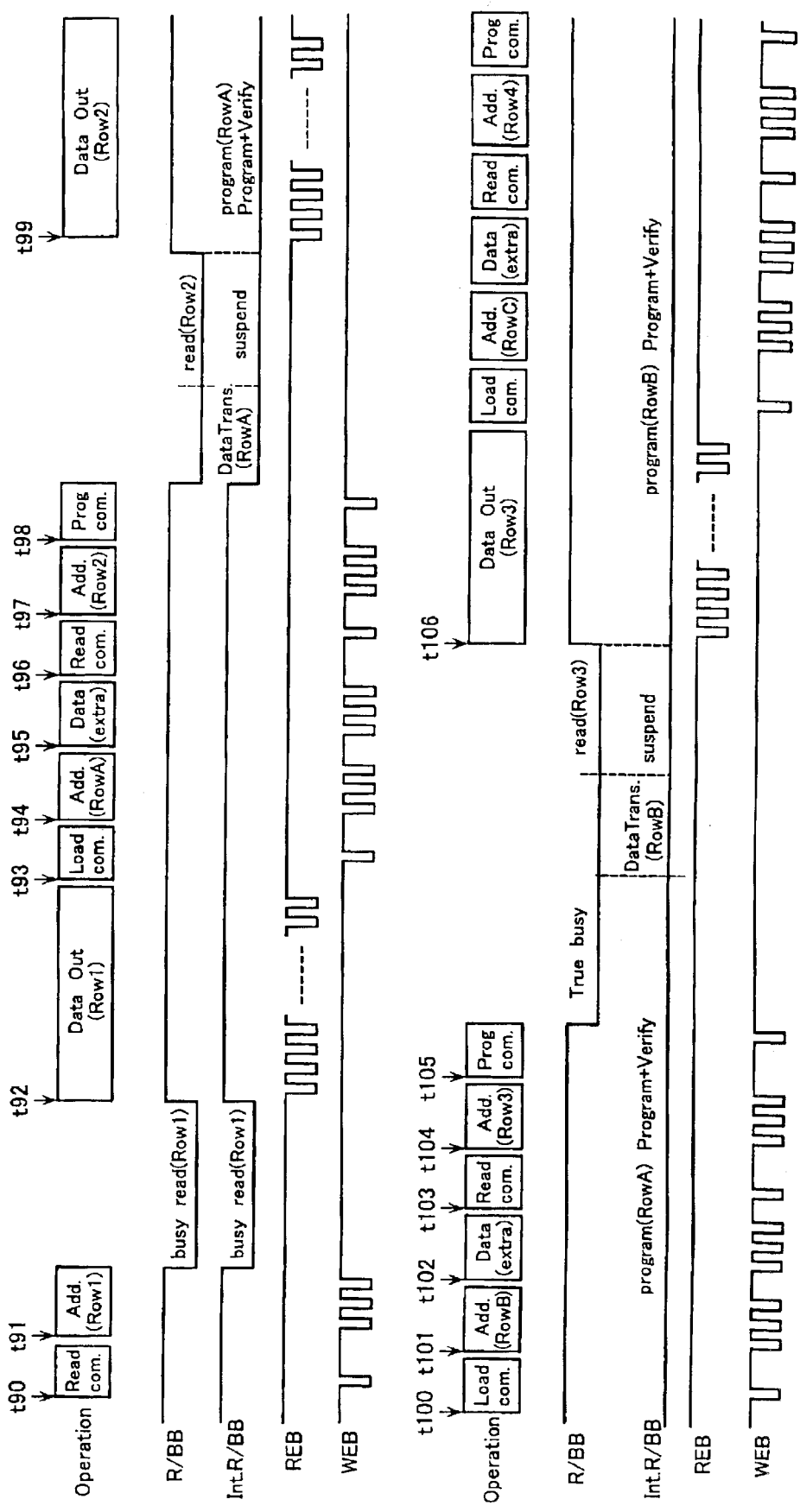
FIG. 13 is a timing diagram of copy write control of an embodiment 4.

FIG. 13 shows an operation control example which employs a command/address input scheme similar to that of the embodiment 3 and maximally reduces the number of busy events occurring in a series of page copy operations. Similarly to the embodiment 3, after having loaded the write data with respect to a copy destination address RowA of the read data of the first address Row1, perform read command input and address input for reading of the next copy source's address Row2 prior to inputting of a write command. Accordingly, the operations of time points t90–t98 of FIG. 13 are the same as the operations at time points t60–t68 of FIG. 12.

This embodiment is different from the embodiment 3 in that the former does not perform reinput of the write address RowA and in that it performs (at time point t99) serial outputting of the read data of address Row2 toward the outside in a way parallel with the copy write operation to the address RowA after having read the data of address Row2 to a page buffer. And, during a write cycle with respect to the address RowA, command, address and data input (at time points t100–t102) for writing checked data into the copy destination address RowB and command/address input (at time points t103, t104) for reading the next copy source's address Row3 are performed in succession.

Figure 20:
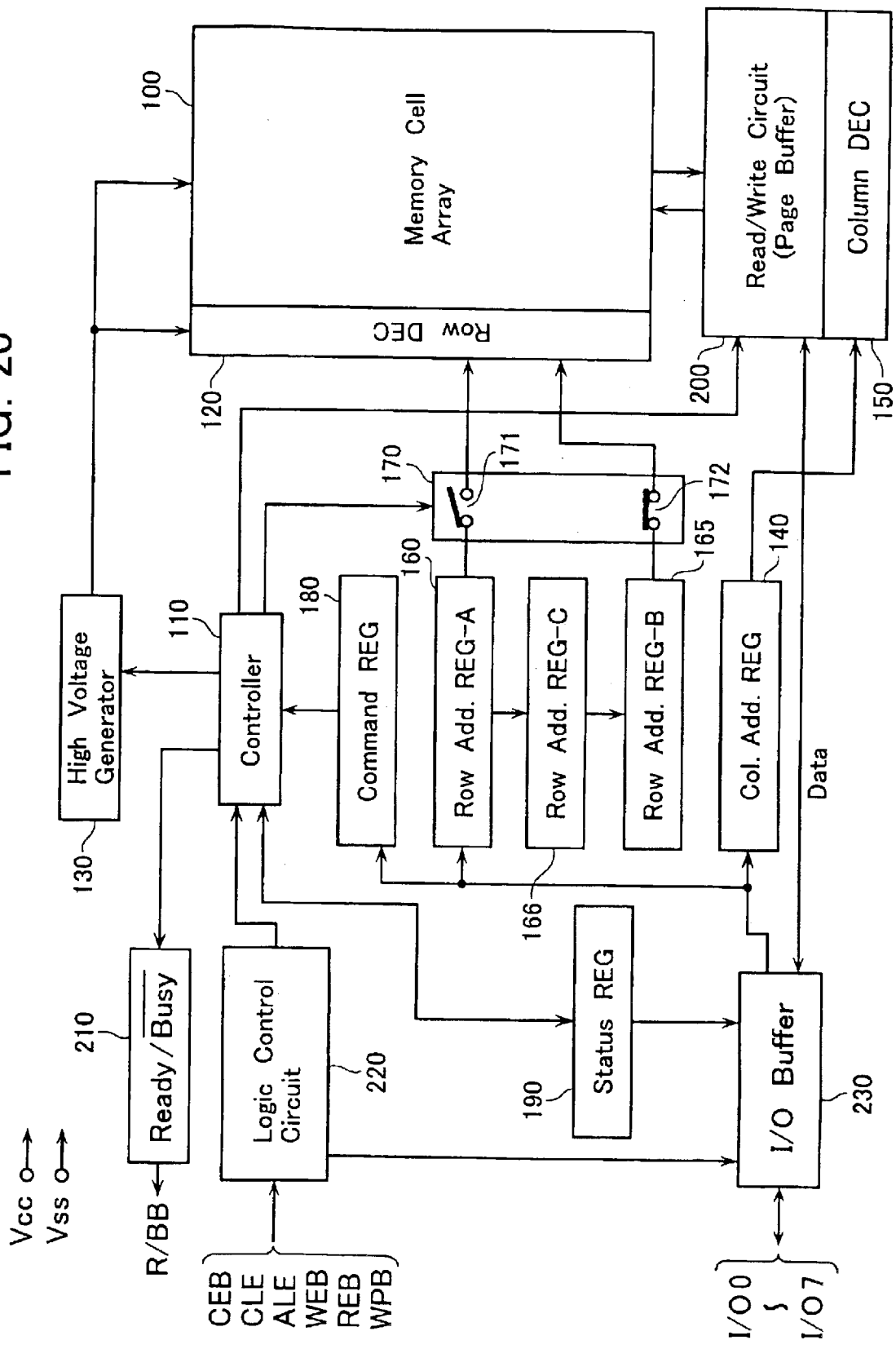
FIG. 20 is a diagram showing a memory arrangement of the embodiment 4 while comparing it to that of FIG. 1.

Consequently, in the case of this embodiment, it becomes necessary to simultaneously hold within the chip the address RowA during writing and the write destination's address RowB after completion of data check and also the address Row3 for performing reading prior to writing to this address RowB. To achieve such address holding, three row address registers 160, 166, 165 are required as shown in FIG. 20. This row-register configuration is in the form that adds the row address register 166 between the row address registers 160, 165 in the arrangement of FIG. 1. A row address to be input is transferred sequentially to one of the registers 160, 166, 165 in this order in the case of a write address.

A detailed explanation will now be given of an internal address transfer and switching operation in FIG. 20 in accordance with the operation control timing of FIG. 13. The first incoming read address Row1 is input to the first row address register 160. This is selected by a switching circuit 170 and then output to a row decoder 120 so that cell data readout is performed. Upon completion of such read operation, the address Row1 is no longer necessary; thus, the write address RowA of the next copy destination is overwritten into the first row address register 160. Subsequently, prior to startup of a write operation, a read address Row2 of the next copy source is input. At this time, the address RowA which is presently held in the first row address register 160 is transferred to the second row address register 166, and the address Row2 is input to the first row address register 160.

And, when the address Row2 is selected and the read operation is ended, the address RowA being held in the second row address register 166 is sent to the third row address register 165. The write address RowA of this row address register 165 is selected by the switch circuit 170 so that a write operation to the address RowA is carried out. Although during a write cycle of this address RowA an address RowB of the next write destination is input, this is overwritten into the first row address register 160. Subsequently, when an address Row3 of the next read destination is input, the write address RowB of the first row address register 160 is passed to the second row address register 166, causing the address Row3 to enter the first row address register 160. At this time point, three row address registers 160, 166, 165 are expected to retain therein the addresses Row3, RowB, RowA, respectively.

In this address data holding state, the address RowB of the second row address register 166 is transferred to the third row address register 165 after the termination of a write cycle due to the address RowA of third row address register 165. And, after a read operation of the address Row3 of first row address register 160 is ended, the next write cycle gets started by the address RowB that has been sent to third row address register 165.

In the way stated above, the transfer rate of copy writing is greatly improved by performing the within-the-chip holding and transfer plus switching of more than one row address to be output to the row decoder and then continuing the copy write operation required.

[Embodiment 5]

The embodiments stated supra are based on the assumption that data reading for copy purposes is done using the normal read scheme (FIG. 14). More specifically, as shown in FIG. 14, "0" data of a selected cell is read to a page buffer as "H" level data, and this is inverted in logic level by a data amplifier 40 to be output to an input/output terminal as "L" level data. With such an arrangement, the data to be serially output to the chip outside became correct logic data. On the other hand, in order to let the data read out to the page buffer be write data, it was necessary to invert its logic level. More specifically as shown in FIG. 16, if the data of the node N21 of the second page buffer 200b is not inverted when transferring toward the node N11 of the first page buffer 200a, it does not become any correct write data. This in turn requires that data be inverted and then input to a page buffer at the event where extra write data is input from the chip outside to modify the copy source data which has been output to the outside and then checked.

In contrast, it is also possible to eliminate the need for inversion transfer of the write data. To do this, a specific read scheme may be employed to perform data readout from a cell, which permits "0" data to have "L" level and "1" data to become "H" level in an adverse way to the embodiments stated previously. Such an embodiment will next be explained below.

Figure 18:
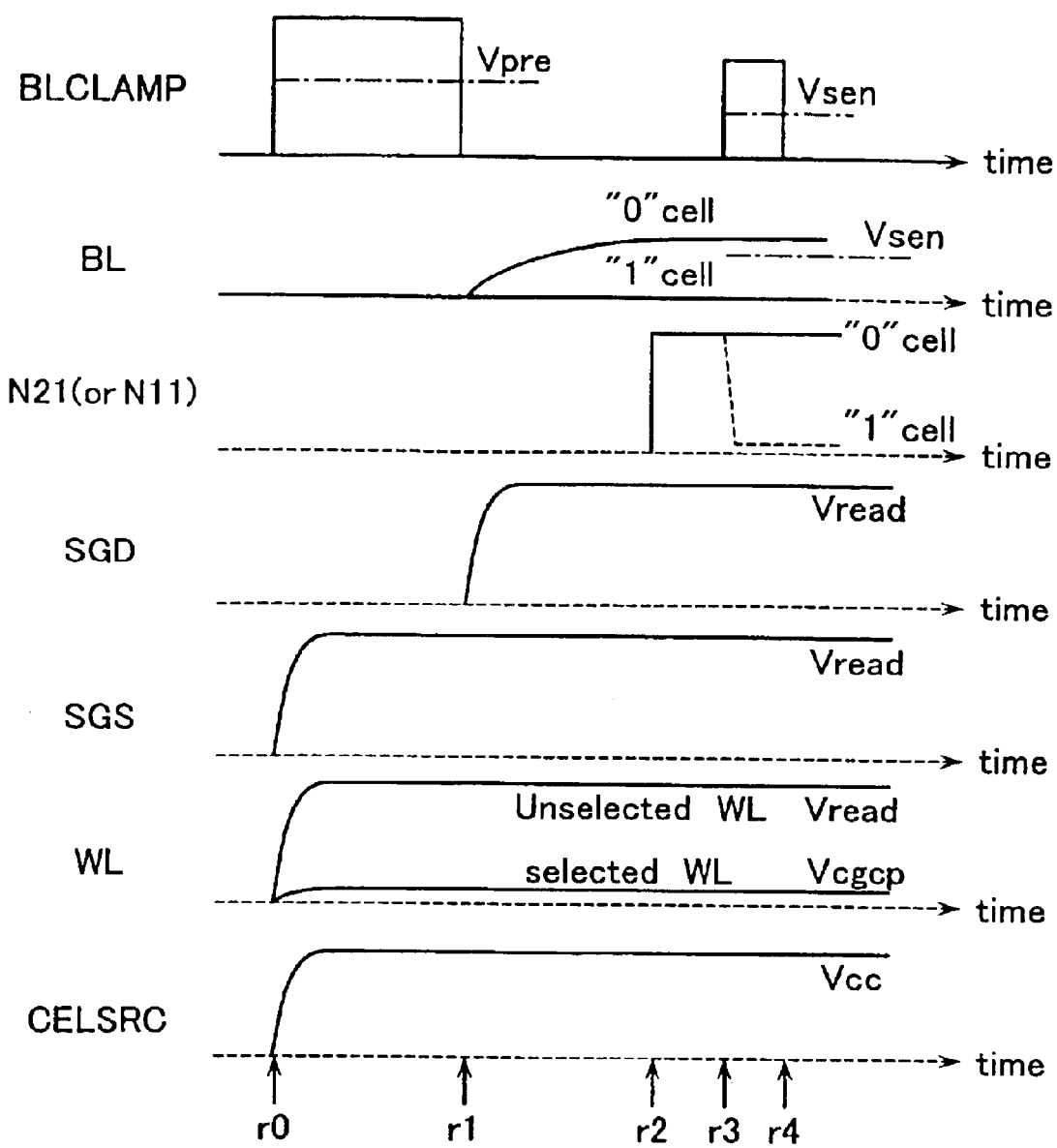
FIG. 18 is a diagram showing voltage waveforms during data read in an embodiment 5.

FIG. 18 shows operation waveforms when directly reading inverted data into the second page buffer 200b in this embodiment 5, in a way corresponding to FIG. 17. The inverted data readout becomes possible by replacing the normal read scheme which causes a cell current to flow from the bitline BL side to the common source line CELSRC with a scheme which permits a cell current to flow from the common source line CELSRC side to a bit line BL. At time point r0, apply a read-use voltage Vcgcp with a potential of about 0 to 0.5V to a selected word line; apply a pass voltage Vread (about 4V) to non-selected word lines within a selected NAND cell; apply Vcc (about 3V) to the common source line CELSRC; apply a pass voltage Vread (about 4V) to the select gate line SGS on the common source line CELSRC side; and apply 0V to the bitline-side select gate line SGD. In this state, apply an "H" level voltage to the control terminal BLCAMP of the clamp transistor 31 to precharge a selected bit line BL to 0V by a page buffer.

When applying the pass voltage Vread (about 4v) to the bitline BL side select gate line SGD at time point r1, the threshold voltage Vt is negative in case a selected memory cell is a "1" cell so that a positive voltage which is represented as Vcgcp-Vt appears on the bit line BL. Adversely, in case the selected memory cell is a "0" cell, the threshold voltage Vt is positive so that the voltage Vcgcp-Vt which appears on the bit line becomes a low voltage with its potential nearly equal to 0V. After having precharged the inside of page buffer 200a at time point r2, apply a read voltage to the clamp transistor 31 at the timing of time point r3 and then sense the bitline potential. A "1" cell data with the bitline potential higher than the sense level Vsen is read as a "H" level data to the node N21 of page buffer 200b. On the contrary, a "0" cell data is read as a "L" level data.

The level relationship of these read data "0" and "1" is the same as that of write data. In the event that this read data is serially output as copy source data toward the chip outside in order to check or inspect the data outside the chip, it is required to invert the data at an appropriate portion on the output route. On the other hand, at the time of data input for addition and/or modification of write data, such data inversion becomes unnecessary.

Figure 21:
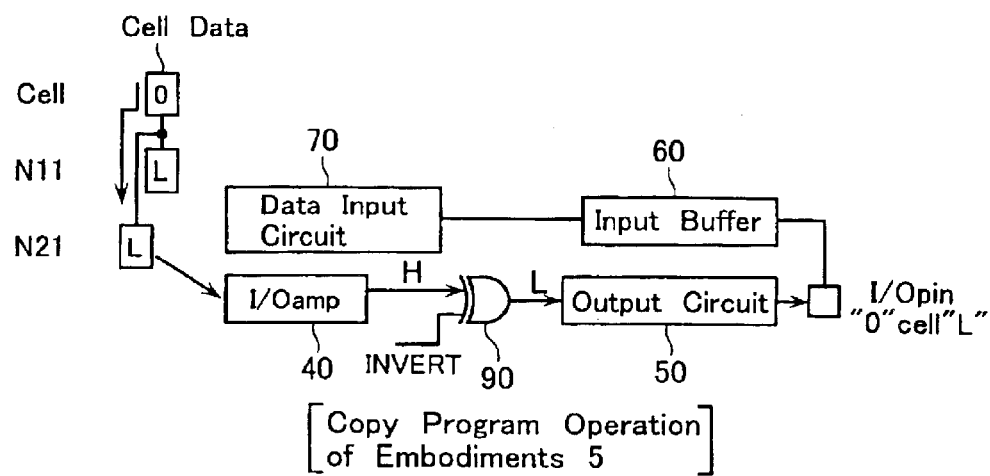
FIG. 21 is a diagram showing the way of data transfer of a copy write operation in the embodiment 5.

The way of cell data inversion reading and data transfer of a data input/output circuit unit in this case is shown in FIG. 21 in a way corresponding to FIG. 16. After having performed the cell data readout for copying purposes, there is level inversion at the output amplifier 40 in the route for serial output of such read data toward the chip outside. In view of this, output an output of the output amp 40 after letting it be again subjected to level inversion by an inverter circuit 90 which is activated by a control signal INVERT= "H." In brief, the inverter circuit 90 is inserted in order to make the logic level of read data from the cell array consistent with that of the data to be read to the chip outside.

Figure 22A:
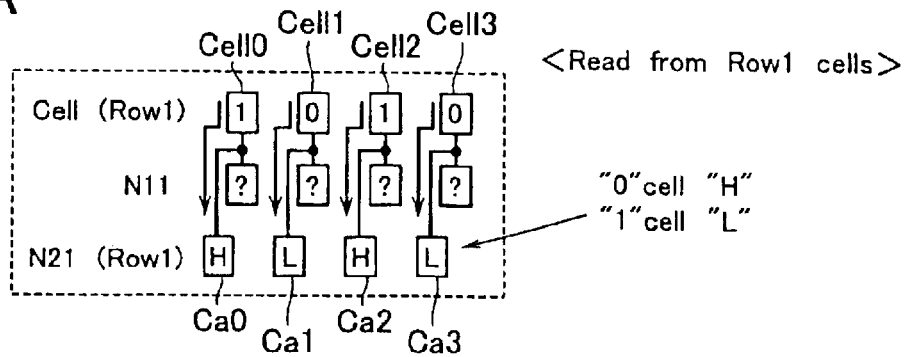
FIGS. 22A–22H are diagrams each showing the data transition state of a copy write operation in the embodiment 5.
Figure 22B:
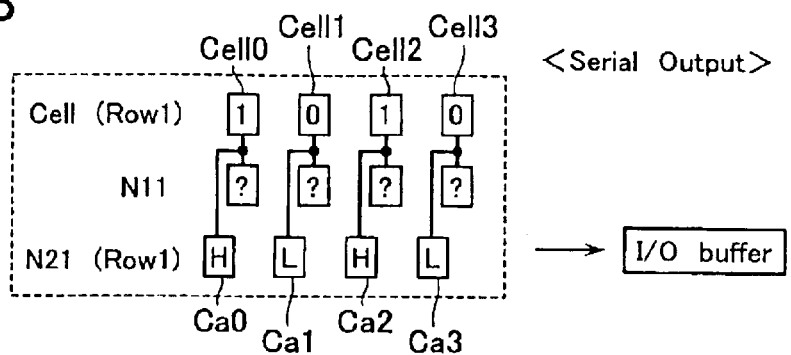

Additionally, data transition states in this case are shown in FIGS. 22A–22H in a way corresponding to FIGS. 10A–10H of the previous embodiment. Although FIG. 22A shows that the same cell data as that of FIG. 10A is in process of reading, the data read to the node N21 of the second page buffer 200b becomes level-inverted data unlike that of FIG. 10A. This read data will be serially output to the outside as shown in FIG. 22B.

Figure 22C:
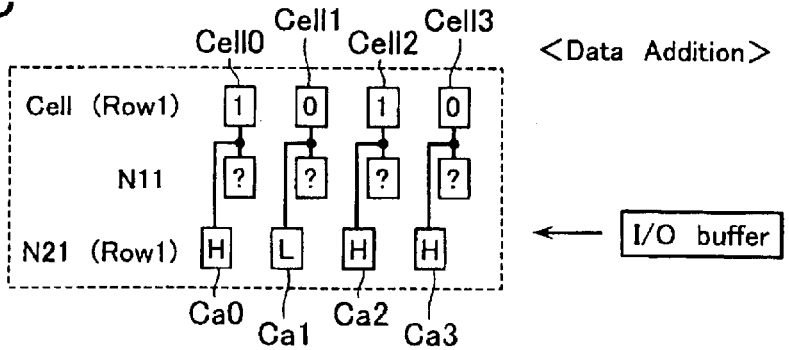
Figure 22D:
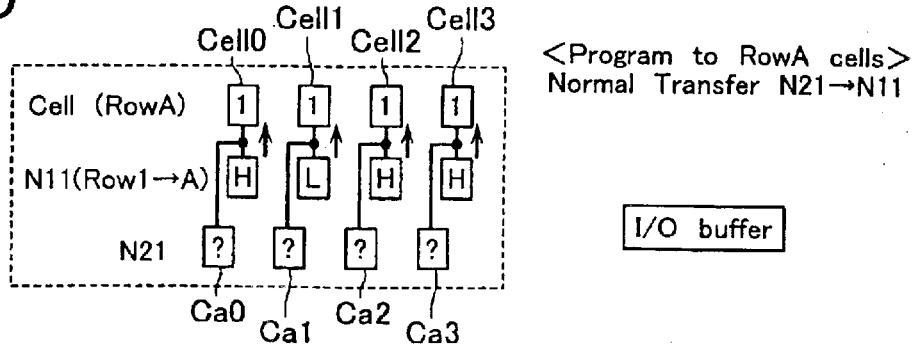

As shown in FIG. 22C, loading of copy write data to the node N21 of the second page buffer 200b is, as different from that of FIG. 10C, done in such a manner that "0" data is as "L" level data. Accordingly, unlike the case of FIG. 10D, the following data transfer toward the node N1 of the second page buffer 200a will become normal transfer without level inversion as shown in FIG. 22D.

Figure 22E:
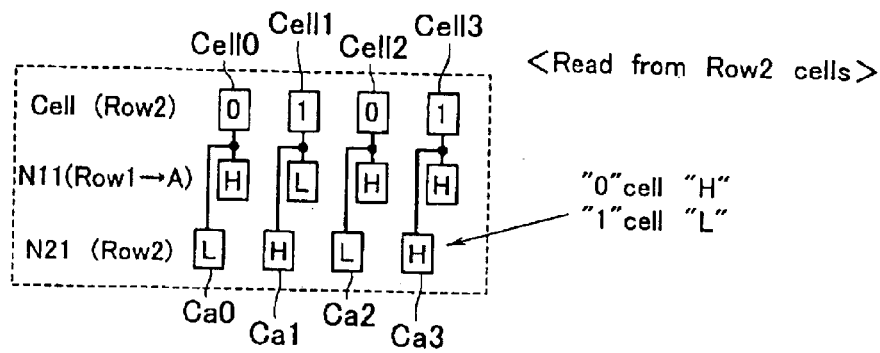
Figure 22F:
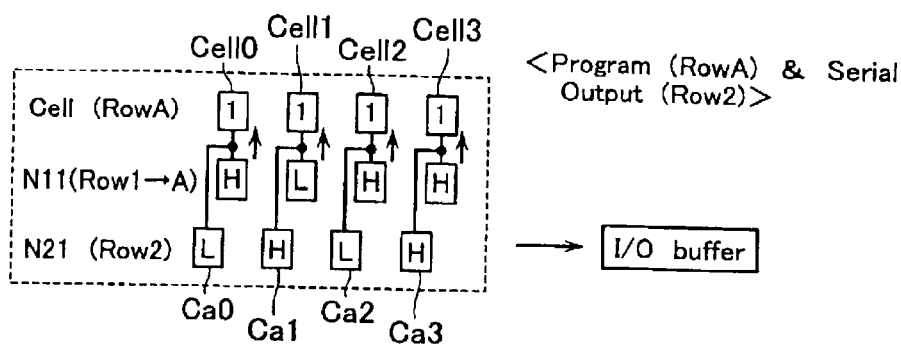
Figure 22G:
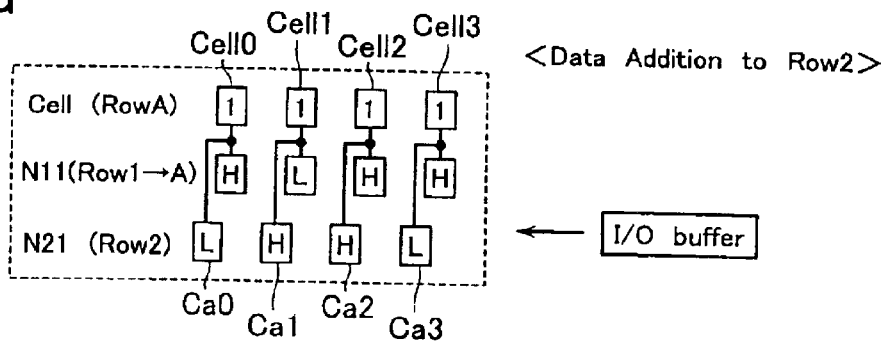
Figure 22H:
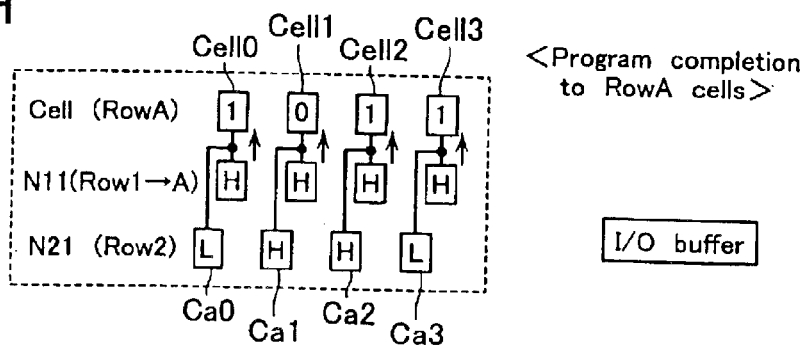
Figure 23:
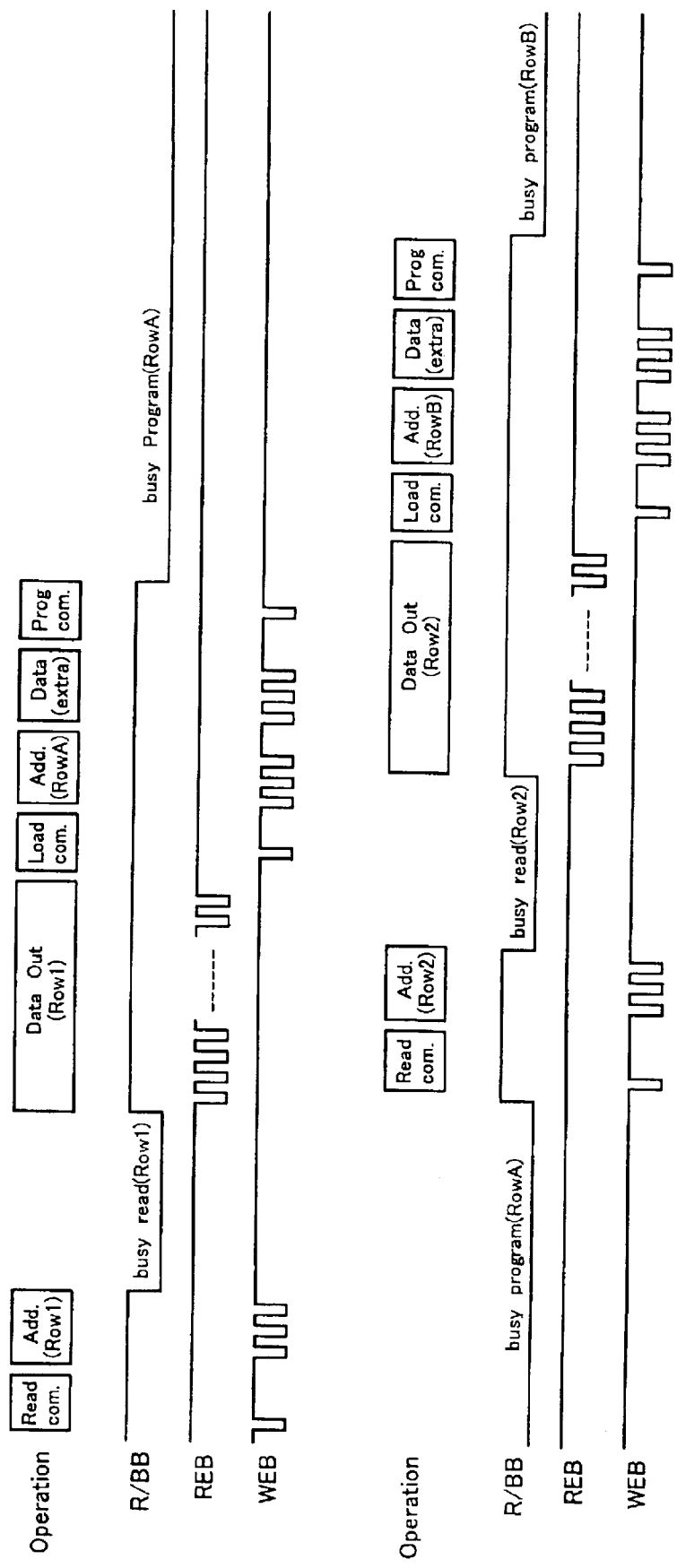
FIG. 23 is a timing diagram of a copy write operation in prior known NAND type flash memory.

Similarly, cell data readout of FIG. 22E also becomes inversion readout. Thereafter, copy writing will be executed in a similar way. This embodiment is the same as the previous embodiments in that the write cycle is ended when all data bits of the first page buffer 200a become "H"s by write-verifying.

As has been explained above, according to this invention, it is possible to improve the transfer rate by forcing a write or programming operation and a read operation to partly overlap each other during the page copy operation of an EEPROM.

While the present invention has been particularly shown and described with reference to the embodiments, it will be understood by those skilled in the art that various changes in form and detail may be made without departing from the spirit, scope, and teaching of the invention.

What is claimed is:

1. A method of performing a series of copy write operations of a non-volatile semiconductor memory device with a memory cell array, in which data read and write are preformed by a page, each copy write operation comprising:

reading data of a page of said memory cell array;

outputting read data outside of said device for performing testing of the read data and adding data if necessary; and writing tested data into another page of said memory cell array, wherein the read data are output outside of said device while the tested data are written into said memory cell array.

2. The method according to claim 1, wherein each reading operation except an initial one is so performed as to interrupt a writing operation.

3. The method according to claim 2, wherein a writing operation is performed by repeat of write voltage application and following write verify, and wherein each reading operation except an initial one interrupts each writing operation at a timing of switching the write voltage application and the following write verify, thereby suspending the writing operation.

4. The method according to claim 3, wherein a reading operation is performed in response to read command and address inputs;

an outputting operation is performed in response to a read enable signal; and the suspended writing operation restarts simultaneously with the outputting operation.

5. The method according to claim 2, wherein
a writing operation is performed by repeat of write voltage application and following write verify, and wherein
each reading operation except an initial one interrupts each writing operation prior to start thereof, thereby suspending the write voltage application thereof.

6. The method according to claim 5, wherein
an idle time is set for waiting a following read command input prior to a writing operation after a write command is input; and
in case there is provided the following read command within the idle time, the write voltage application is suspended.

7. The method according to claim 5, wherein
an idle time is set to be constant for waiting a following read command input prior to the writing operation after a write command is input; and
in case any read command input is absent, the writing operation starts after elapse of the idle time.

8. The method according to claim 5, wherein
a reading operation is performed in response to read command and address inputs;
an outputting operation is performed in response to a read enable signal; and
the suspended writing operation starts simultaneously with the outputting operation.

9. The method according to claim 1, wherein
said memory cell array is formed of a plurality of NAND cell units arranged therein, each NAND cell unit including:
plural memory cells connected in series, control gates of which are coupled to different word lines; a first select gate transistor disposed to couple one end of the NAND cell unit to a bit line; and a second select gate transistor disposed to couple the other end to a common source line.

10. A method of performing a series of copy write operations of a non-volatile semiconductor memory device with a memory cell array and first and second page buffers, each copy write operation comprising:
reading data of a page of said memory cell array into said second page buffer;
outputting read data stored in said second page buffer outside of said device for performing testing of the read data and adding data if necessary;
loading tested data in said second page buffer as write data;
transferring the write data stored in said second page buffer to said first page buffer; and
writing the write data stored in said first page buffer into another page of said memory cell array, wherein
the read data in said second page buffer are output outside of said device while the write data in said first page buffer are written into said memory cell array.

11. The method according to claim 10, wherein
each reading operation except an initial one is so performed as to interrupt a writing operation.

12. The method according to claim 11, wherein
a writing operation is performed by repeat of write voltage application and following write verify, and wherein
each reading operation except an initial one interrupts each writing operation at a timing of switching the write voltage application and the following write verify, thereby suspending the writing operation.

13. The method according to claim 12, wherein
a reading operation is performed in response to read command and address inputs;
an outputting operation is performed in response to a read enable signal; and
the suspended writing operation restarts simultaneously with the outputting operation.

14. The method according to claim 11, wherein
a writing operation is performed by repeat of write voltage application and following write verify, and wherein
each reading operation except an initial one interrupts each writing operation prior to start thereof, thereby suspending the write voltage application thereof.

15. The method according to claim 14, wherein
an idle time is set for waiting a following read command input prior to a writing operation after a write command is input; and
in case there is provided the following read command within the idle time, the write voltage application is suspended.

16. The method according to claim 14, wherein
an idle time is set to be constant for waiting a following read command input prior to the writing operation after a write command is input; and
in case any read command input is absent, the writing operation starts after elapse of the idle time.

17. The method according to claim 14, wherein
a reading operation is performed in response to read command and address inputs;
an outputting operation is performed in response to a read enable signal; and
the suspended writing operation starts simultaneously with the outputting operation.

18. The method according to claim 10, wherein
said memory cell array is formed of a plurality of NAND cell units arranged therein, each NAND cell unit including:
plural memory cells connected in series, control gates of which are coupled to different word lines; a first select gate transistor disposed to couple one end of the NAND cell unit to a bit line; and a second select gate transistor disposed to couple the other end to a common source line.

19. A non-volatile semiconductor memory device comprising:
a memory cell array including electrically erasable and programmable memory cells;
a row decoder connected to the memory cell array;
a set of page buffers connected to the memory cell array;
input/output terminals coupled to the set of page buffers, wherein
a first chunk of data in the set of page buffers is read out through the input/output terminals while a second chunk of data in the set of page buffers is written into the memory cell array.

20. A non-volatile semiconductor memory device comprising:
a memory cell array including electrically rewritable and non-volatile memory cells;
a row decoder connected to said memory cell array for selecting a page thereof;

first and second page buffers connected to said memory cell array and configured to be data-transferable therebetween; and input/output terminals coupled to the second page buffers, wherein a series of copy write operations are performed in such a way that read data of a page of the memory cell array are output through the input/output terminals for testing and adding data if necessary, and then written into another page of the memory cell array, and wherein read data in the second page buffer are read out through the input/output terminals while write data, which are read data in the preceding cycle and transferred from the second page buffer to the first page buffer, are written into the memory cell array.

* * * * *